United States Patent
Kamiya

(10) Patent No.: US 9,508,900 B2
(45) Date of Patent: Nov. 29, 2016

(54) LIGHT-EMITTING DEVICE

(71) Applicant: TOYODA GOSEI CO., LTD., Kiyosu-shi (JP)

(72) Inventor: Masao Kamiya, Kiyosu (JP)

(73) Assignee: Toyoda Gosei, Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/960,360

(22) Filed: Dec. 5, 2015

(65) Prior Publication Data
US 2016/0172540 A1    Jun. 16, 2016

(30) Foreign Application Priority Data

Dec. 15, 2014 (JP) ................... 2014-252858
Sep. 21, 2015 (JP) ................... 2015-186135

(51) Int. Cl.
| | | |
|---|---|---|
| H01L 33/32 | (2010.01) | |
| H01L 33/42 | (2010.01) | |
| H01L 33/40 | (2010.01) | |
| H01L 33/38 | (2010.01) | |
| H01L 21/02 | (2006.01) | |
| H01L 33/00 | (2010.01) | |
| H01L 33/14 | (2010.01) | |

(52) U.S. Cl.
CPC ............ *H01L 33/32* (2013.01); *H01L 33/38* (2013.01); *H01L 33/40* (2013.01); *H01L 33/42* (2013.01); *H01L 21/0254* (2013.01); *H01L 21/02458* (2013.01); *H01L 33/0025* (2013.01); *H01L 33/145* (2013.01)

(58) Field of Classification Search
CPC ....... H01L 33/32; H01L 33/40; H01L 33/38; H01L 33/79; H01L 33/145; H01L 33/075; H01L 33/10; H01L 33/0025; H01L 33/0075; H01L 21/0254; H01L 21/02458
USPC .................. 257/103, 79, 88, 94–99, E33.07, 257/E33.064, E33.067; 438/22, 25, 26, 27, 438/29, 47
See application file for complete search history.

(56) References Cited

U.S. PATENT DOCUMENTS

2011/0260196 A1*  10/2011  Okagawa ................ H01L 33/22
                                                      257/98

FOREIGN PATENT DOCUMENTS

| JP | 2008-192710 A | 8/2008 |
|---|---|---|
| JP | 2010-232649 A | 10/2010 |

* cited by examiner

*Primary Examiner* — Thinh T Nguyen
(74) *Attorney, Agent, or Firm* — McGinn IP Law Group, PLLC

(57) ABSTRACT

A light-emitting device has a current blockage layer formed between a p-layer and a transparent electrode. A region of the transparent electrode on the current blockage layer has a higher sheet resistance as compared with the remaining region. The current blockage layer has a circular planar pattern containing a contact portion of a p-electrode. A straight line L passing through an arbitrary position in the contact portion and extending to a contact portion of an n-electrode with the shortest distance is defined. The center O' of the width of the current blockage layer in the direction of the straight line L is located more remote from the contact portion of the n-electrode than is the center O of the width of the contact portion of the p-electrode in the direction of the straight line L. This structure can suppress an increase in drive voltage.

20 Claims, 15 Drawing Sheets

LIGHT-EMITTING DEVICE

BACKGROUND OF THE INVENTION

Field of the Invention

The present invention relates to a light-emitting device made of a group III nitride semiconductor. More particularly, the present invention relates to such a light-emitting device characterized by the position and planar pattern of a current blockage layer.

Background Art

There has been known a technique for a light-emitting device made of a group III nitride semiconductor in which a portion of a light-emitting layer which overlaps a p-electrode in plan view is prevented from emitting light, whereby absorption of light by the p-electrode is prevented so as to improve light emission efficiency.

Patent Documents 1 and 2 disclose a light-emitting device made of a group III nitride semiconductor in which a current blockage layer made of a light transmissible insulator is provided between a p-layer and a transparent electrode in a region immediately below a p-pad electrode so as to prevent a portion of the light-emitting layer immediately below the p-pad electrode from emitting light and to cause light to be reflected at the interface between the p-layer and the current blockage layer to thereby improve light emission efficiency.
Patent Document 1: Japanese Patent Application Laid-Open (kokai) No. 2008-192710
Patent Document 2: Japanese Patent Application Laid-Open (kokai) No. 2010-232649

In the case where the current blockage layer is provided on the p-layer, the transparent electrode is provided to cover the p-layer and the current blockage layer, and the p-electrode is further provided on the transparent electrode to be located above the p-layer. Thus, through the transparent electrode, current diffuses to regions other than the region where the current blockage layer is provided. Therefore, the sheet resistance of the transparent electrode must be lowered.

However, there has been a problem in that, depending on the combination of the materials selected for the current blockage layer and the transparent electrode, the configurations of the current blockage layer and the transparent electrode, the conditions for treatment after formation, etc., the sheet resistance of the transparent electrode on the current blockage layer may increase after formation thereof, which results in an increase in the drive voltage of the light-emitting device. For example, such a problem occurs in the case where a material containing indium oxide as a main component is used to form the transparent electrode and a material containing oxygen as a constituent element, such as $SiO_2$ or SiON, is used to form the current blockage layer.

SUMMARY OF THE INVENTION

The present invention has been accomplished for solving the aforementioned problems involved in conventional techniques. An object of the present invention is to provide a light-emitting device which can mitigate the influence of an increase in the sheet resistance of a transparent electrode located on a current blockage layer. In particular, an object of the present invention is to suppress an increase in the drive voltage of the light-emitting device. Another object of the present invention is to increase the degree of uniformity of light emission of the light-emitting device.

The present invention is a light-emitting device comprising an n-layer, a light-emitting layer, and a p-layer which are semiconductor layers each made of a group III nitride semiconductor and are deposited in this order; a transparent electrode which is located on the p-layer and is made of a transparent, electrically conductive oxide; at least one p-side current injection portion which is located on the transparent electrode and in contact with the transparent electrode; at least one n-side current injection portion connected to the n-layer; and a current blockage layer which is made of an insulator and is disposed between the p-layer and the transparent electrode to be located below the p-side current injection portion, wherein the current blockage layer is provided in a region which contains the p-side current injection portion in plan view; and when a straight line passing through an arbitrary position in the p-side current injection portion and extending to the n-side current injection portion such that the distance between that position and the n-side current injection portion becomes shortest is defined as a straight line L, the center of the width of the p-side current injection portion in the direction of the straight line L is defined as a center O, and the center of the width of the current blockage layer in the direction of the straight line L is defined as a center O', the center O and the center O' do not overlap in the direction of the straight line L.

In the case where the center O' of the width of the current blockage layer in the direction of the straight line L is located more remote from the n-side current injection portion in the direction of the straight line L than is the center O of the width of the p-side current injection portion in the direction of the straight line L, an increase in drive voltage due to an increase in the sheet resistance of the transparent electrode located on the current blockage layer can be suppressed.

Also, in the case where the center O' of the width of the current blockage layer in the direction of the straight line L is located closer to the n-side current injection portion in the direction of the straight line L than is the center O of the width of the p-side current injection portion in the direction of the straight line L, the uniformity of light emission can be improved by controlling the flow of electrons within the device.

Also, as to the direction of deviation of the center O' of the width of the current blockage layer from the center O of the width of the p-side current injection portion, the above-described two layouts may be mixedly employed in a single chip.

One example of such a structure is as follows: when the distance between each p-side current injection portion and the n-side current injection portion closest to that p-side current injection portion assumes one of a plurality of values between a maximum distance and a minimum distance and one half of the sum of the maximum distance and the minimum distance is defined as an average distance, for a p-side current injection portion whose distance to the closest n-side current injection portion is between the maximum distance and the average distance, there is used the layout in which the center O' of the width of the current blockage layer in the direction of the straight line L is located more remote from the n-side current injection portion in the direction of the straight line than is the center O of the width of the p-side current injection portion in the direction of the straight line L. Another example of such a structure is as follows: for a p-side current injection portion whose distance to the closest n-side current injection portion is between the minimum distance and the average distance, there is used the layout in which the center O' of the width of the current blockage layer in the direction of the straight line L is located closer to the n-side current injection portion in the direction of the straight line than is the center O of the width of the p-side current injection portion in the direction of the straight line L.

This structure realizes more uniform light emission on the surface.

Another structural example is as follows: for each p-side current injection portion, a positional deviation of the center O' of the current blockage layer from the center O of the p-side current injection portion and the direction of the positional deviation are determined in order to obtain a planar light emission distribution which is more uniform than a planar light emission distribution obtained when the center O of the p-side current injection portion and the center O' of the current blockage layer are rendered coincident with each other. Irrespective of the structure of the electrode, more uniform light emission can be obtained on the surface of a single chip. Also, since the current density is made uniform, the drive voltage can be decreased as compared with the case where the center O' and the center O are rendered coincident with each other.

Although the current blockage layer can have an arbitrary planar pattern, the entirety or a portion of a blockage layer outline of a planar pattern of the current blockage layer which contains the p-side current injection portion is desirably an outline obtained through similarity enlargement of an injection portion outline of a planar pattern of the p-side current injection portion, from the viewpoint of uniformity of light emission and easiness of manufacture.

Instead of the method of shifting the position of the planar pattern of the current blockage layer itself, other methods may be used in order to render the center O of the width of the p-side current injection portion in the direction of the straight line L different, in the direction of the straight line L, from the center O' of the width of the current blockage layer in the direction of the straight line L. Namely, the blockage layer outline of the portion which contains the p-side current injection portion has a shape obtained by partially cutting away a shape obtained through similarity enlargement of the injection portion outline with the centroid of the injection portion outline used as the center of the enlargement. In other words, instead of shifting the position of the planar pattern, the shape of the planar pattern is changed.

Although the present invention is particularly effective in the case where the sheet resistance of the transparent electrode in a region above the current blockage layer is higher than the sheet resistance of the transparent electrode in a region above the p-layer, the present invention can be applied to other cases.

Although an arbitrary transparent, electrically conductive oxide may be used for the transparent electrode, an indium-oxide-base material such as IZO (zinc-doped indium oxide) or ITO (tin-doped indium oxide) is preferred from the viewpoint of easiness of manufacture and cost.

Although an arbitrary material formed of an insinuator may be used for the current blockage layer, use of an arbitrary material made of a transparent insulator containing oxygen as a constituent element is preferred, from the viewpoint of light extraction, etc. The term "transparent" means that the insulator has a high transmissivity for the light emission wavelength of the light-emitting device. $SiO_2$, SiON, $Al_2O_3$, $TiO_2$, $ZrO_2$, $HfO_2$, $Nb_2O_5$, or the like may be used. Particularly, silicon compounds are preferred.

Particularly, the present invention is effective for light-emitting devices having the following structures.

A light-emitting device further comprising an insulation film located on the transparent electrode and having a hole for injecting current to the transparent electrode; and a p-electrode located on the insulation film, wherein the p-electrode is in contact with the transparent electrode through the hole, and a portion of the p-electrode which is located within the hole and is in contact with the transparent electrode serves as the p-side current injection portion.

A light-emitting device further comprising an intermediate electrode which is located on the transparent electrode and is in contact with the transparent electrode; an insulation film located on the transparent electrode and the intermediate electrode and having a hole for injecting current to the intermediate electrode electrode; and a p-electrode located on the insulation film, wherein the p-electrode is in contact with the intermediate electrode, and the intermediate electrode serves as the p-side current injection portion.

A light-emitting device further comprising a p-electrode which is located on the transparent electrode and is in contact with the transparent electrode, wherein the p-electrode has a connection portion which is electrically connected to an external circuit, and a wiring-like portion extending from the connection portion as wiring, and the p-electrode serves as the p-side current injection portion.

In all the above-described inventions, it is desired that the minimum positional deviation between the center O' of the current blockage layer and the center O of the p-side current injection portion be set to 2 μm. The maximum positional deviation is a positional deviation when the center O' is shifted from the center O by the greatest amount under a condition that the orthogonal projection of the p-side current injection portion onto the current blockage layer is present within the surface of the current blockage layer.

According to the present invention, even when the sheet resistance of the transparent electrode on the current blockage layer increases, the influence of the increase can be suppressed, whereby the light emission efficiency can be increased, and the uniformity of light emission can be improved.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

First Embodiment

Figure 1:
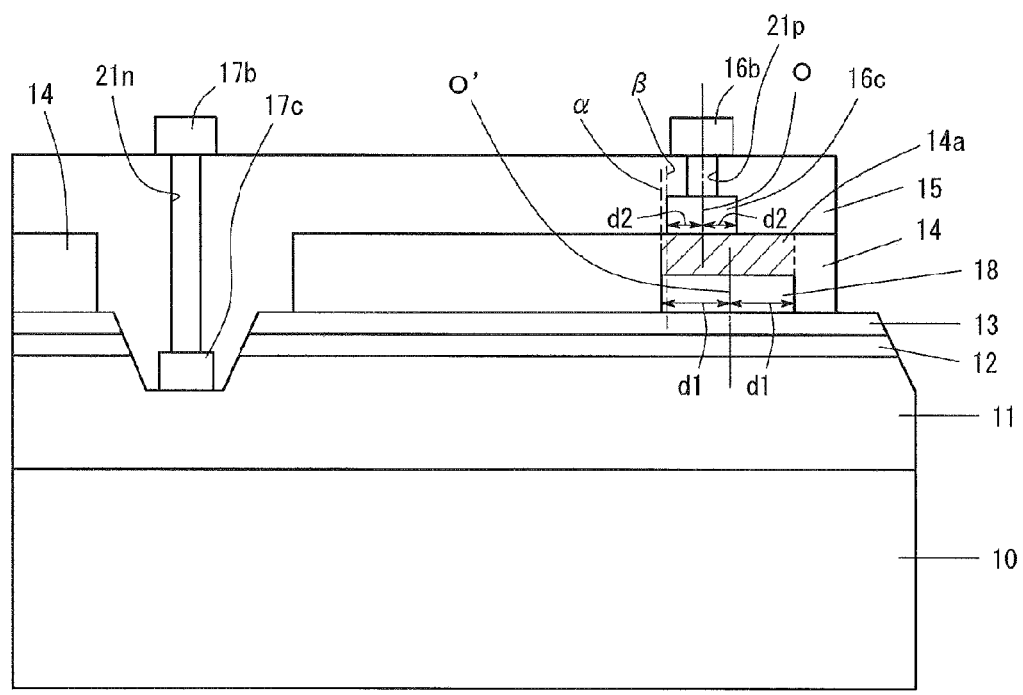
FIG. 1 is a cross-sectional view showing the structure of a light-emitting device of a first embodiment.
Figure 2:
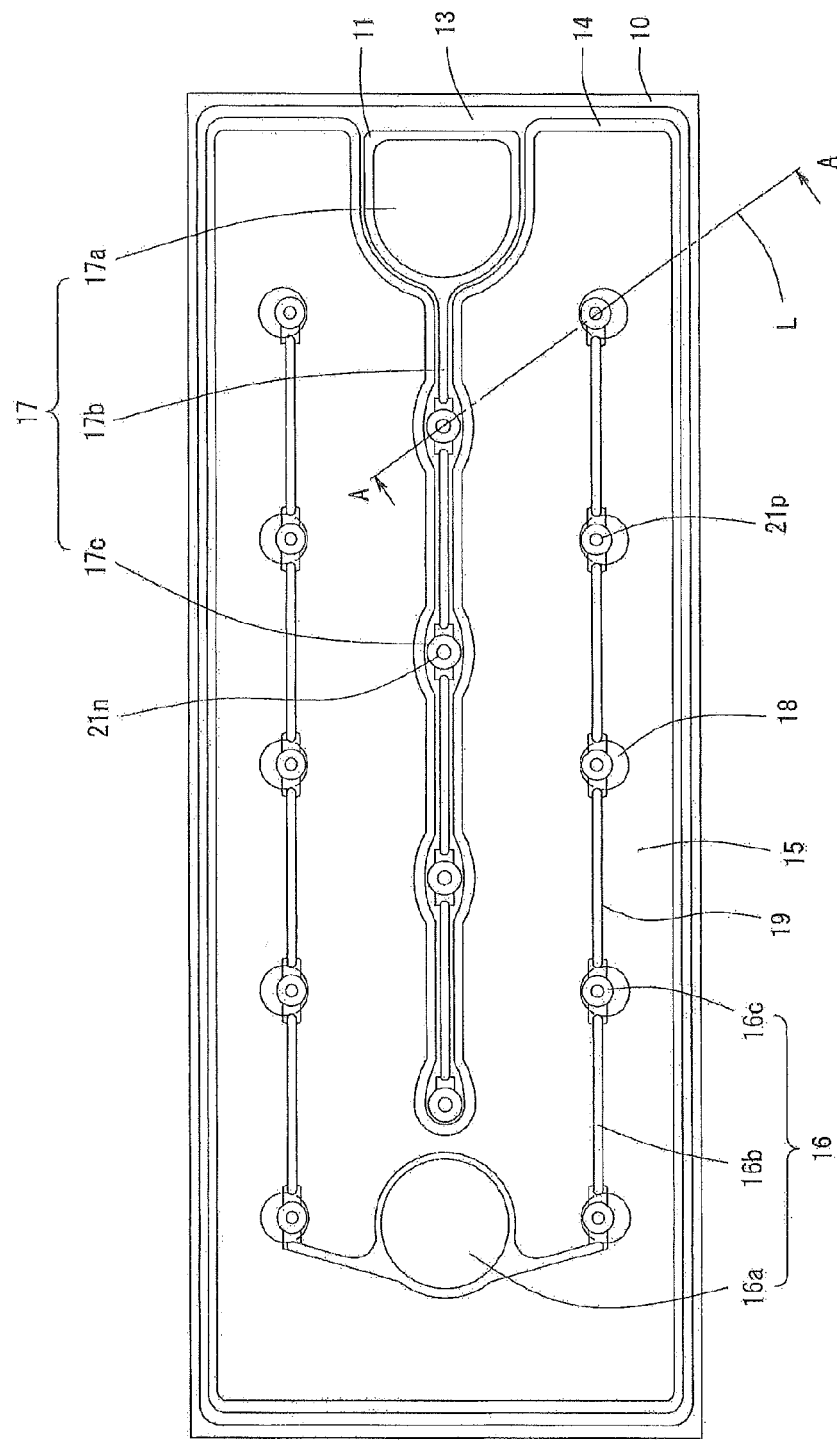
FIG. 2 is a plan view of the light-emitting device of the first embodiment as viewed from the upper side thereof.

FIG. 1 is a cross-sectional view showing the structure of one chip of a light-emitting device of a first embodiment which is made of a group III nitride semiconductor. FIG. 2 is a plan view of the light-emitting device of the first embodiment as viewed from the upper side thereof. FIG. 1 is a cross-sectional view taken along line A-A in FIG. 2. As shown in FIG. 2, the light-emitting device of the first embodiment which is made of a group III nitride semiconductor is a face-up-type device having a rectangular shape in plan view. The chip has a rectangular shape, its short sides have a length of 200 μm, and its long sides have a length of 800 μm. Notably, the chip may be formed such that the length of its short sides falls within a range of 200 to 300 μm and the length of its long sides falls within a range of 700 to 800 μm.

As shown in FIG. 1, the light-emitting device of the first embodiment which is made of a group III nitride semiconductor has a substrate 10, an n-layer 11 disposed on the substrate 10 through a buffer layer (not shown), a light-emitting layer 12 located on the n-layer 11, and a p-layer 13 located on the light-emitting layer 12. Each of the n-layer 11, the light-emitting layer 12, and the p-layer 13 is made of a group III nitride semiconductor. A groove is formed to extend from the front surface of the p-layer 13 and reach the n-layer 11, and the n-layer 11 is exposed at the bottom of the groove. Also, the light-emitting device has a transparent electrode 14 located on the p-layer 13, and an insulation film 15 which continuously extends over the transparent electrode 14 and the n-layer 11 exposed at the bottom of the groove. A p-electrode 16 and an n-electrode 17 are separately provided on the insulation film 15. Further, current blockage layers 18 are provided in predetermined regions between the p-layer 13 and the transparent electrode 14. Below, each structural element will be described in further detail.

The substrate 10 is a sapphire substrate having irregularities on the surface on the n-layer 11 side. The irregularities are provided so as to increase light extraction efficiency. An arbitrary material other than sapphire may be used to form the substrate 10 so long as the material allows crystal growth of the group III nitride semiconductor. For example, SiC, Si, ZnO, or the like may be used to form the substrate 10.

The n-layer 11 has a structure in which an n-type contact layer, an n-type ESD layer, and an n-type SL layer are deposited in this order from the side where the substrate 10 is present. The n-type contact layer is a layer with which the n-electrode 17 is in contact. The n-type contact layer is an n-type GaN layer having an Si concentration of $1 \times 10^{18}/cm^3$ or greater. Alternatively, the n-type contact layer may be formed of a plurality of layers having different carrier concentrations so as to reduce the contact resistance of the n-electrode 17. The n-type ESD layer is an electrostatic breakdown-preventing layer for preventing electrostatic breakdown of the device. The n-type ESD layer has a structure in which a non-doped GaN layer and a Si-doped n-type GaN layer are deposited. The n-type SL layer is an n-type superlattice layer having a superlattice structure formed by repeatedly depositing a unit structure a plurality of times. The unit structure is composed of an InGaN layer, a GaN layer, and an n-type GaN layer successively deposited. The n-type SL layer is a layer for relaxing the stress applied to the light-emitting layer 12.

The light-emitting layer 12 has an MQW structure formed by repeatedly depositing a well layer made of InGaN and a barrier layer made of AlGaN. A protection layer for preventing evaporation of In may be provided between the well layer and the barrier layer.

The p-layer 13 has a structure in which a p-type clad layer and a p-type contact layer are deposited in this order from the side where the light-emitting layer 12 is present. The p-type clad layer is a layer for preventing electrons from diffusing to the p-type contact layer. The p-type clad layer is formed by repeatedly depositing a unit structure a plurality of times. The unit structure is composed of a p-type InGaN layer and a p-type AlGaN layer successively deposited. The p-type contact layer is a layer provided to allow the p-electrode 16 to properly contact with the p-layer 13. The p-type contact layer is a p-type GaN layer having an Mg concentration of $1 \times 10^{19}$ to $1 \times 10^{22}/cm^3$ and a thickness of 100 to 1000 angstroms.

Notably, the structures of the n-layer 11, the light-emitting layer 12, and the p-layer 13 are not limited to the above-described structures, and any of the structures employed in conventional light-emitting devices made of a group III nitride semiconductor may be employed.

The transparent electrode 14 is made of IZO (zinc-doped indium oxide). Alternatively, an indium-oxide-base material such as ITO (tin-doped indium oxide) or other transparent, electrically conductive oxides may be used. The transparent electrode 14 is formed to continuously extend over the p-layer 13 and the current blockage layers 18. Therefore, the transparent electrode 14 is formed into the shape of a film which waves upward at positions above the current blockage layers 18. Fine irregularities may be formed on the surface of the transparent electrode 14 so as to improve light extraction efficiency.

Of the transparent electrode 14, a region 14a located on the current blockage layer 18 has a higher sheet resistance as compared with the remaining region. This phenomenon occurs mainly for the following reason. The sheet resistance of the region of the transparent electrode 14 which is located on and in contact with the p-layer 13 does not change greatly even when the transparent electrode 14 undergoes heat treatment in an electrode formation process. In contrast, the sheet resistance of the region 14a of the transparent electrode 14 which is located on and in contact with the current blockage layer 18 increases after the heat treatment. Also, as will be described later, an increase in the resistance of the region 14a which is located on and in contact with the current blockage layer 18 also occurs due to the influence of the irregularities on the surface of the current blockage layer 18.

The insulation film 15 is formed to continuously cover the surface of the n-layer 11 exposed at the bottom of the groove and the surface of the transparent electrode 14. The insulation film 15 is made of $SiO_2$. Instead of $SiO_2$, SiN, $Al_2O_3$, $TiO_2$, or the like may be used. Also, holes 21p for the p-electrode 16 and holes 21n for the n-electrode 17 are formed in the insulation film 15 at predetermined positions such that they penetrate the insulation film 15. The holes 21p are filled with a wiring-like portion 16b of the p-electrode 16 which will be described later, and the holes 21n are filled with a wiring-like portion 17b of the n-electrode 17. A contact portion between the transparent electrode 14 and the wiring-like portion 16b charged into each hole 21p is a contact portion 16c (intermediate electrode) of the p-electrode 16. A contact portion between the n-type contact layer of the n-layer 11 and the wiring-like portion 17b charged into each hole 21n is a contact portion 17c of the n-electrode 17.

Within the insulation film 15, a reflection film 19 is provided in a region overlapping the p-electrode 16 and the n-electrode 17 in plan view (however, the contact portions 16c and 17c are excluded) as shown in FIG. 2. Since the reflection film 19 is located within the insulation film 15, it is electrically insulated, whereby migration is prevented. This reflection film 19 is provided so as to suppress absorption of light by the p-electrode 16 and the n-electrode 17 by reflecting light propagating toward the p-electrode 16 and the n-electrode 17, to thereby improve light emission efficiency.

The reflection film 19 is made of a material which is higher in reflectance than the materials of the p-electrode 16 and the n-electrode 17. Examples of such a material include Al, Ag, Al alloy, and Ag alloy. The reflection film 19 may have a single-layer structure or a multi-layer structure. In the case where the reflection film 19 has a multi-layer structure, a layered structure of Al alloy/Ti, a layered structure of Ag alloy/Al, a layered structure of Ag alloy/Ti, a layered structure of Al/Ag/Al, a layered structure of Ag alloy/Ni, or any other suitable layered structure may be used. The symbol "/" means depositing, and A/B means a layered structure in which a layer of A is first formed and a layer of B is then formed. The symbol "/" will be used in the same meaning in the description of materials provided below. In order to enhance the adhesion between the reflection film 19 and the insulation film 15, a thin film of Ti, Cr, Al, or the like may be provided between the reflection film 19 and the insulation film 15.

Alternatively, a dielectric multi-layer film may be used as the reflection film 19. The dielectric multi-layer film is a multi-layer film which is formed by alternately depositing a material having a low refractive index and a material having a high refractive index and which is designed such that the optical film thickness of each layer becomes equal to ¼ of the wavelength of emitted light. $SiO_2$, $MgF_2$, or the like may be used as the material having a low refractive index, and SiN, $TiO_2$, $ZrO_2$, $Ta_2O_5$, $Nb_2O_5$, or the like may be used as the material having a high refractive index. In order to increase the reflectance of the dielectric multi-layer film, it is desired to increase the difference in refractive index between the material having a low refractive index and the material having a high refractive index. Also, it is desired to increase the number of the pairs of the deposited materials, and it is desired to deposit 5 or more pairs each including the material having a low refractive index and the material having a high refractive index. However, the number of the pairs of the deposited materials is preferably set to 30 or less in order prevent the overall thickness of the dielectric multi-layer film from becoming excessively larger and causing a problem in a manufacturing process.

As shown in FIG. 2, the p-electrode 16 is composed of a wire bonding portion 16a, the wiring-like portions 16b, and the contact portions 16c (the p-side current injection portion and the intermediate electrode of the present invention). FIG. 4 is a view showing, on an enlarged scale, one contact portion 16c shown in the plan view of FIG. 2. FIG. 4 is a plan view (as viewed from the upper side toward the lower side) showing the relation among the orthogonal projections of one wiring-like portion 16b, one hole 21p, one contact portion 16c corresponding thereto, and one current blockage layer 18 corresponding thereto. FIG. 4 is illustrated under the assumption that the insulation film 15 and the transparent electrode 14 are not present (are transparent). This also applies to FIG. 3B, FIG. 5, and FIG. 9. The contact portions 16c are made of Ni/Au/Al, and the wire bonding portion 16a and the wiring-like portions 16b are made of Ti/Au/Al.

The wire bonding portion 16a is a circular region which is located on the insulation film 15 and which is connected to a wire. The wiring-like portions 16b are portions which are similar to wiring, are located on the insulation film 15, and extend from the wire bonding portion 16a. The wiring-like portions 16b diffuse current in a planar direction by functioning as wiring. Also, the wiring-like portions 16b are formed in the holes 21p provided in the insulation film 15. The contact portions 16c are a plurality of dot-shaped circular regions provided on the transparent electrode 14. The contact portions 16c are connected to the wiring-like portion 16b through the holes 21p provided in the insulation film 15. The contact portions 16c are provided so as to establish excellent contact between the p-electrode 16 and the transparent electrode 14. The holes 21p and the contact portions 16c are not required to have the same shape in plan view so long as each hole 21p is contained in the corresponding contact portion 16c in plan view.

As shown in FIG. 2, the wire bonding portion 16a is located near the center of one short side. Two straight wiring-like portions 16b extend from the wire bonding portion 16a. The wiring-like portions 16b include a straight portion which is located near one long side and extends therealong and a straight portion which is located near the other long side and extends therealong. Each straight portion branches vertically through the holes 21p, and the end of each branch is connected to the corresponding circular contact portion 16c. Notably, from the viewpoint of current diffusion, it is desired to make the center of each hole 21p coincident with the center of the corresponding contact portion 16c.

Like the p-electrode 16, the n-electrode 17 is composed of a wire bonding portion 17a, the wiring-like portion 17b, and the contact portions 17c (the n-side current injection portion of the present invention), which have the same roles as those of the corresponding portions of the p-electrode 16. As shown in FIG. 2, the wire bonding portion 17a is located near the center of an end side opposite the side where the wire bonding portion 16a is located. The single straight wiring-like portion 17*b* extends from the wire bonding portion 17*a* in parallel with the long sides, and is located between the two straight wiring-like portions 16*b* and at the centers of the short sides. The wire bonding portion 17*a* and the wiring-like portion 17*b* of the n-electrode 17 are made of the same material as that used to form the wire bonding portion 16*a* and the wiring-like portions 16*b* of the p-electrode 16, and the contact portions 17*c* are made of the same material as that used to form the contact portions 16*c*.

Figure 3A:
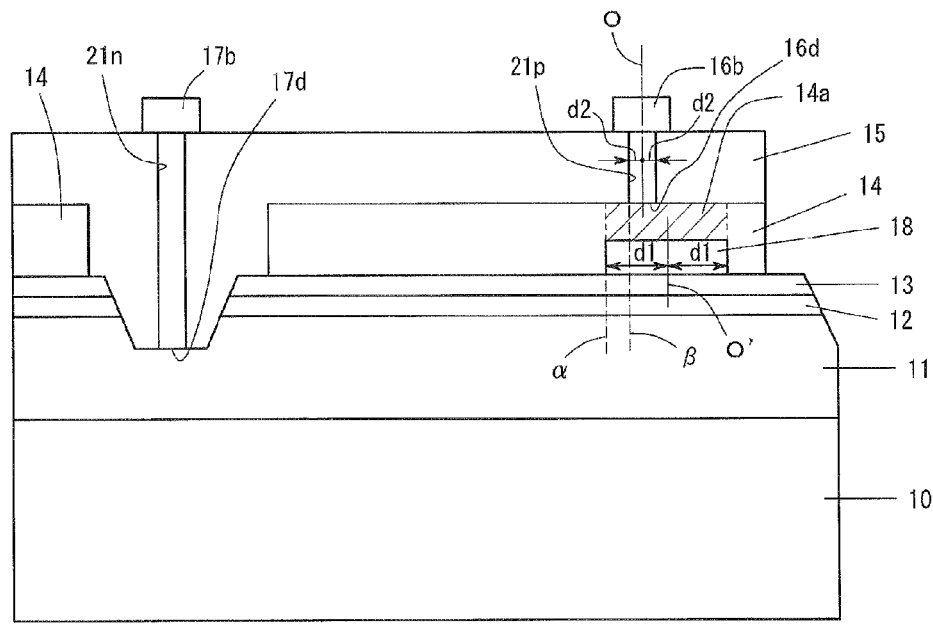
FIG. 3A is a cross-sectional view showing the structure of a light-emitting device of a modification of the first embodiment.
Figure 3B:
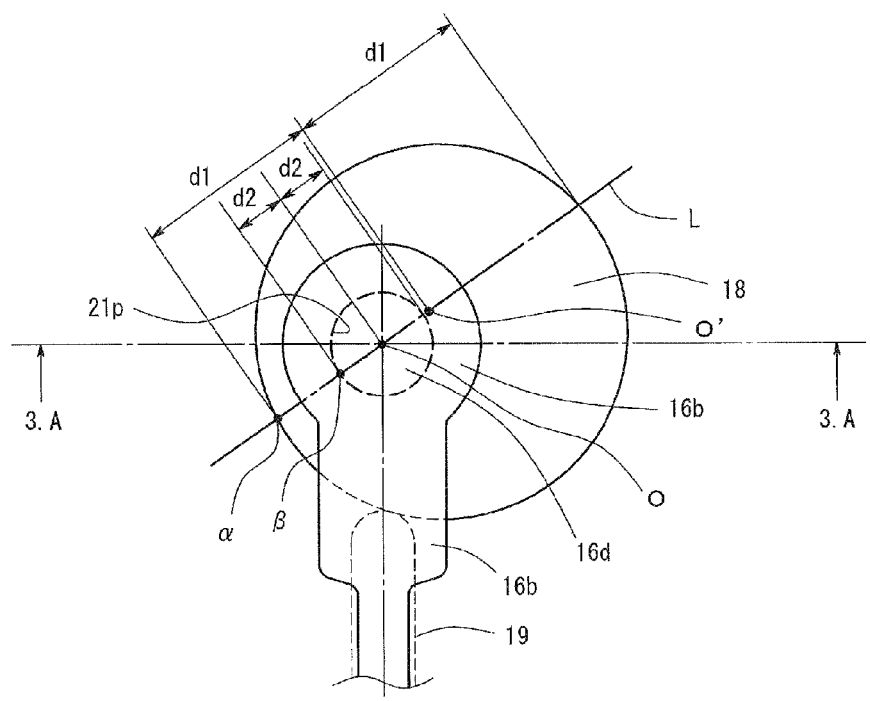
FIG. 3B is a plan view of a portion of the light-emitting device shown in FIG. 3A, the portion including a contact portion 16d.
Figure 4:
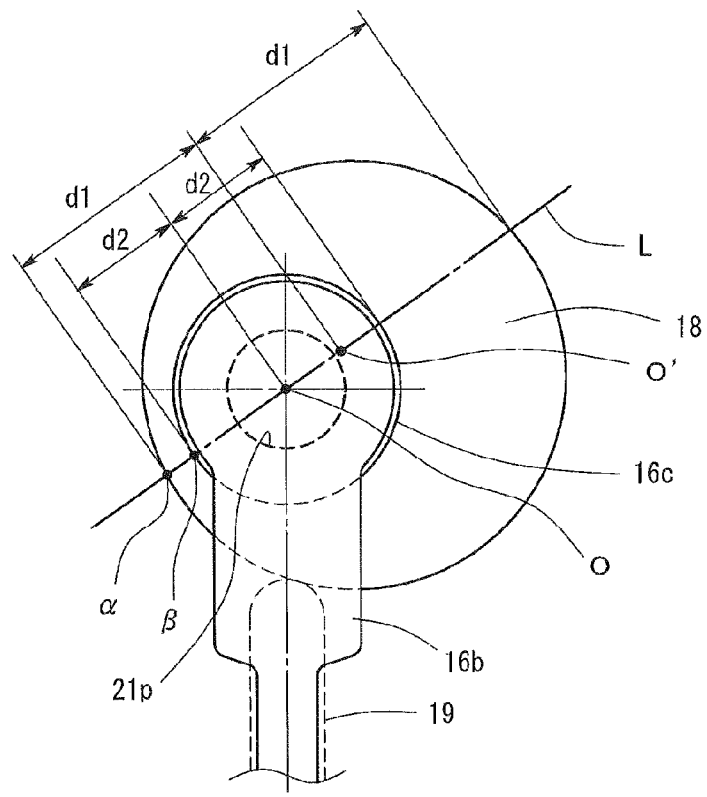
FIG. 4 is an enlarged view showing a portion of the plan view of FIG. 2, the portion including a contact portion 16c.

Notably, as shown in FIG. 3A and FIG. 3B which is a plan view of a portion of a light-emitting device shown in FIG. 3A, the portion including one wiring-like portion 16*b* of the p-electrode 16 and one hole 21*p*, the light-emitting device may be configured such that the contact portions 16*c* is omitted, and the wiring-like portion 16*b* is brought into direct contact with the transparent electrode 14 and is connected thereto. In this case, a portion (a contact portion 16*d*) of the wiring-like portion 16*b* which is in contact with the transparent electrode 14 corresponds to the p-side current injection portion of the present invention. Similarly, the light-emitting device may be configured such that the contact portions 17*c* are omitted, and the wiring-like portion 17*b* is brought into direct contact with the n-layer 11 and is connected thereto. In this case, a portion (a contact portion 17*d*) of the wiring-like portion 17*b* which is in contact with the contact layer of the n-layer 11 corresponds to the n-side current injection portion of the present invention. FIG. 3A shows the case where none of the contact portions 16*c* and 17*c* are provided. Also, the p-electrode 16 and the n-electrode 17 are not necessarily required to have the wiring-like portions 16*b* and 17*b*, respectively.

The region of the p-electrode 16 excluding the wire bonding portion 16*a* and the region of the n-electrode 17 excluding the wire bonding portion 17*a* are covered with a protection film (not shown). This protection film prevents formation of a short circuit.

Each current blockage layer 18 blocks current from flowing through its region to thereby prevent the light-emitting layer 12 from emitting light in a region which overlaps the current blockage layer 18 in plan view (a region corresponding to orthogonal projection of the current blockage layer 18 onto the light-emitting layer 12). Further, by means of total reflection at the interface between the p-layer 13 and the current blockage layer 18, light is prevented from propagating toward the upper side of the current blockage layer 18. These two actions suppress absorption and shielding of light by the p-electrode 16 located on the upper side of the current blockage layer 18, to thereby improve light emission efficiency.

As shown in FIGS. 1, 2, 3B, and 4, each current blockage layer 18 is formed on the p-layer 13 in a region which includes a corresponding contact portion 16*c* or 16*d* as viewed in plan view. Namely, in plan view, each current blockage layer 18 contains a corresponding contact portion 16*c* or 16*d*. As a result of provision of each current blockage layer 18 in a region somewhat larger than the corresponding contact portion 16*c* or 16*d*, absorption and shielding of light by the contact portion 16*c* or 16*d* is suppressed effectively. In the present embodiment, no current blockage layer 18 is provided in orthogonal projection regions of other portions of the p-electrode 16; i.e., orthogonal projection regions of the wire bonding portion 16*a* and the wiring-like portions 16*b*. However, the current blockage layer 18 may be provided in the orthogonal projection regions of the wire bonding portion 16*a* and the wiring-like portions 16*b*.

Also, as shown in FIGS. 1, 4, and 3B, each current blockage layer 18 is a circular layer which contains a corresponding contact portion 16*c* or 16*d* in plan view, and the center of the contact portion 16*c* or 16*d* does not coincide with the center of the current blockage layer 18. Such a case corresponds to the case where the entirety of the blockage layer outline of the planar pattern of the current blockage layer 18 which contains the p-side current injection portion 16*c* or 16*d* is obtained through similarity enlargement of the injection portion outline of the planar pattern of the p-side current injection portion 16*c* or 16*d*.

The center of the contact portion 16*c* or 16*d* is rendered different from the center of the current blockage layer 18 by the following method. There is defined a straight line L which passes through an arbitrary position (for example, the center of the circle in plan view) in the contact portion 16*c* of the p-electrode 16 in plan view, and passes through an arbitrary position (for example, the center of the circle in plan view) in one of the large number of contact portions 17*c* of the n-electrode 17 which is closest to that contact portion 16*c*. The center of the width of the contact portion 16*c* of the p-electrode 16 in the direction of the straight line L is denoted by O, and the center of the width of the current blockage layer 18 in the direction of the straight line L is denoted by O'. The width means the length of a segment obtained by cutting the straight line L at opposite ends of the contact portion 16*c* or the current blockage layer 18. The center O' is located more remote from the contact portion 17*c* of the n-electrode 17 than is the center O. However, the positional deviation of the center O' from the center O is a deviation within a range within which the current blockage layer 18 contains the contact portion 16*c*.

Since the straight line L does not necessarily pass through the center (the center of the circle) of the current blockage layer 18 in plan view, the center O' of the width of the current blockage layer 18 in the direction of the straight line L does not necessarily coincide with the center (the center of the circle) of the current blockage layer 18 in plan view. Similarly, since in some cases the straight line L is not set to pass through the center of the circle of the contact portion 16*c* and the center of the circle of the contact portion 17*c*, the center O of the width of the contact portion 16*c* in the direction of the straight line L does not necessarily coincide with the center (the center of the circle) of the contact portion 16*c* in plan view.

In the first embodiment, as compared with the center of the circular pattern of the contact portion 16*c*, the center of the circular pattern of the current blockage layer 18 is located more remote from the contact portion 17*c* in the short-side direction of the light-emitting device, whereby the above-described relation between the centers O and O' is satisfied.

FIGS. 1 and 4 show, as an example, the case where the straight line L is a straight line which connects the center of the circle of the contact portion 16*c* of the p-electrode 16 and the center of the circle of the contact portion 17*c* of the n-electrode 17, and the center O of the width of the contact portion 16*c* in the direction of the straight line L is rendered coincident with the actual center of the circle of the contact portion 16*c* in plan view. The cross-sectional view of FIG. 1 is a cross-sectional view taken along A-A line of FIG. 2 which extends along the straight line L.

Notably, in the first embodiment, the planar pattern of each current blockage layer 18 has a circular shape obtained through similarity enlargement of the planar pattern of each contact portion 16*c*. However, the planar shape of each current blockage layer 18 is not required to be similar to the planar shape of each contact portion 16*c*. For example, the current blockage layer 18 may be formed such that it has a planar pattern determined through similarity enlargement of the planar pattern of the contact portion 16c such that the center (centroid) of the current blockage layer 18 coincides with the center (centroid) of the contact portion 16c, and the pattern of the current blockage layer 18 is partially cut away, whereby the center O' of the width of the current blockage layer 18 in the direction of the straight line L can be easily rendered different from the center O of the width of the contact portion 16c in the direction of the straight line L. Namely, it is possible to render the centers O' and O different from each other (prevent the centers O' and O from overlapping each other) by simple means of providing a cutout in the conventional pattern of the current blockage layer 18 whose center coincides with that of the contact portion 16c and whose pattern is obtained through similarity enlargement of the pattern of the contact portion 16c.

Figure 5:
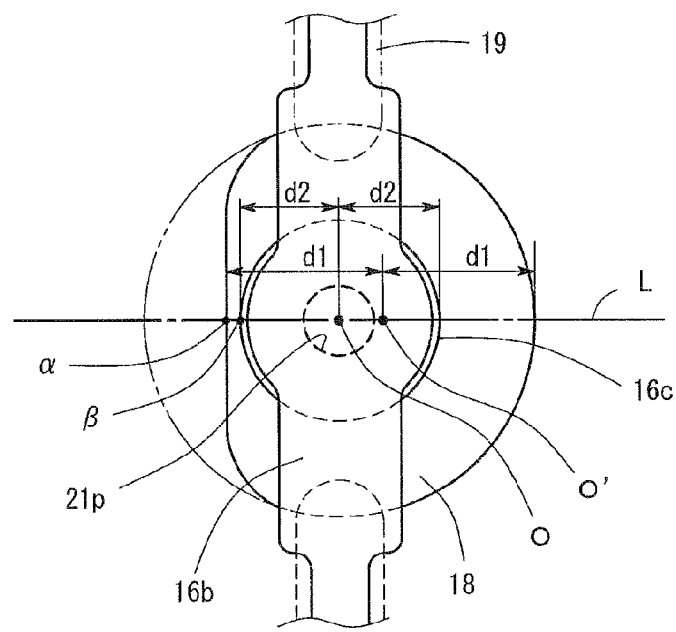
FIG. 5 is a view showing a modification of the planar pattern of a current blockage layer 18.

FIG. 5 shows an example of a pattern with a cutout. FIG. 5 shows the case where the straight line L passes through the center of the circle of the contact portion 16c (the center O of the width in the straight line L coincides with the center of the circle). The current blockage layer 18 has a circular planar pattern. The center of the current blockage layer 18 coincides with the center of the contact portion 16c, and the diameter of the current blockage layer 18 is greater than that of the contact portion 16c. A portion of the circular current blockage layer 18 located on the side closer to the contact portion 17c of the n-electrode 17 is cut away. As a result of formation of a cutout, the center O' of the width of the current blockage layer 18 in the direction of the straight line L can be shifted from the center O of the width of the contact portion 16c in a direction away from the contact portion 17c in the direction of the straight line L. Such a case corresponds to the case where a portion of the blockage layer outline of the planar pattern of the current blockage layer 18 which contains the p-side current injection portion 16c is obtained through similarity enlargement of the injection portion outline of the planar pattern of the p-side current injection portion 16c.

Instead of $SiO_2$, other transparent insulators which include oxygen as a constituent element; in particular, silicon compounds, may be used to form the current blockage layers 18. Examples of such transparent insulators are metal oxides and metal nitride oxides. Specifically, SiON, $Al_2O_3$, $TiO_2$, $ZrO_2$, $HfO_2$, $Nb_2O_5$, and the like may be used. Also, various types of insulators such as nitrides (AlN, SiN, etc.), carbides (SiC, etc.), and fluorides may be used. However, when an insulator containing oxygen as a constituent element is used, the region 14a of the transparent electrode 14 located on each current blockage layer 18 becomes more likely to have a higher sheet resistance as compared with the remaining region of the transparent electrode 14, and the effect of the present invention can be obtained easily. Each current blockage layer 18 may be formed by a single layer made of any of the above-mentioned materials or a plurality of layers made of any or some of the above-mentioned materials. Each current blockage layer 18 may be monocrystalline, polycrystalline, or amorphous. Alternatively, each current blockage layer 18 may be a dielectric multi-layer film formed by alternately depositing two types of films whose optical thicknesses are equal to the quarter wavelength and which have different refractive indexes. When such a dielectric multi-layer film is used, due to the improved reflectance, the amount of light propagating toward the p-electrode 16 decreases, and the amount of light absorbed by the p-electrode 16 decreases. Therefore, the light emission efficiency can be improved further.

Also, it is desired that each current blockage layer 18 be formed through use of an arbitrary material whose refractive index is smaller than that of the p-layer 13. In this case, it is possible to improve the light extraction efficiency by totally reflecting light at the interface between the p-layer 13 and the current blockage layer 18 to thereby prevent light from propagating toward the p-electrode 16. In the case where the p-layer 13 is formed by a plurality of layers, it is sufficient that the refractive index of each current blockage layer 18 is lower than that of a p-layer closest to the current blockage layer 18. In the case where the p-layer 13 is formed by successively depositing a p-type clad layer and a p-type contact layer from the substrate side, it is sufficient to form each current blockage layer 18 through use of a material whose refractive index is lower than that of the p-type contact layer.

Also, preferably, each current blockage layer 18 has an inclined side surface which is inclined by 5 to 60° with respect to the surface of the p-layer 13. Namely, it is preferred that each current blockage layer 18 have a trapezoidal shape (taper shape) as viewed in a cross section orthogonal to the device. Such a shape prevents breakage of the transparent electrode 14, the p-electrode 16, wires, etc. A more preferred inclination angle is 5 to 30°. Notably, in the case where the side surface of each current blockage layer 18 is inclined as described above, the width of the current blockage layer 18 in the direction of the straight line L is the wide on the lower surface (the surface on the p-layer 13 side) of the current blockage layer 18, and the center of that width is denoted by O'. Also, in the case where the side surface of each contact portion 16c is inclined, the width of the contact portion 16c in the direction of the straight line L is the wide on the lower surface (the surface on the side where the contact portion 16c is in contact with the transparent electrode 14) of the contact portion 16c, and the center of that width is denoted by O.

It is desired that the thickness of each current blockage layer 18 is greater than $\lambda/(4n)$ ($\lambda$ is the wavelength of emitted light, and n is the refraction index of the current blockage layer 18). When each current blockage layer 18 has a thickness greater than $\lambda/(4n)$, the current blockage layer 18 can have a sufficiently high insulation performance and a sufficiently high reflection function. More desirably, each current blockage layer 18 has a thickness of 100 nm or greater. Also, it is desired that the thickness of each current blockage layer 18 is less than 1500 nm for the following reason. If the thickness of each current blockage layer 18 is greater than 1500 nm, the level difference (or step) produced by the thick current blockage layer 18 causes problems such as breakage of wires, the transparent electrode 14, the p-electrode 16, or the like. More desirably, each current blockage layer 18 has a thickness of 500 nm or less.

As described above, in the light-emitting device of the first embodiment which is made of a group III nitride semiconductor, each current blockage layer 18 has a pattern which contains a corresponding contact portion 16c in plan view, and, when a straight line passing through an arbitrary position in the contact portion 16c and extending to a contact portion 17c of the n-electrode 17 such that the distance between that position and the contact portion 17c becomes shortest is defined as a straight line L, the current blockage layer 18 is provided in such a manner that the center O' of the width of the current blockage layer 18 in the direction of the straight line L is located more remote from the contact portion 17c of the n-electrode 17 than is the center O of the width of the contact portion 16c of the p-electrode 16 in the direction of the straight line L. By virtue of this configuration, an effect of suppressing in an increase in the drive voltage can be attained. The reason why such an effect is attained will be described below.

When the transparent electrode 14 made of IZO is formed on each current blockage layer 18 made of $SiO_2$ and then heat treatment is performed, the sheet resistance of the region 14a of the transparent electrode 14 located above the current blockage layer 18 increases as compared with that before the heat treatment. Conceivably, such a phenomenon occurs because oxygen contained in the current blockage layer 18 diffuses and is captured by the transparent electrode 14 at the time of the heat treatment, whereby the amount of oxygen contained in the transparent electrode 14 becomes excessively large and the amount of carriers decreases.

It is also considered that the sheet resistance of the region 14a of the transparent electrode 14 increases due to the irregularities on the surface of each current blockage layer 18. Namely, since the transparent electrode 14 is formed along the irregularities on the surface of each current blockage layer 18, if the irregularities are large, the thickness of the transparent electrode 14 on the current blockage layer 18 varies and becomes ununiform, or the transparent electrode 14 breaks at a step. As a result, the sheet resistance of the region 14a of the transparent electrode 14 becomes higher than that of the remaining region.

Figure 6A:
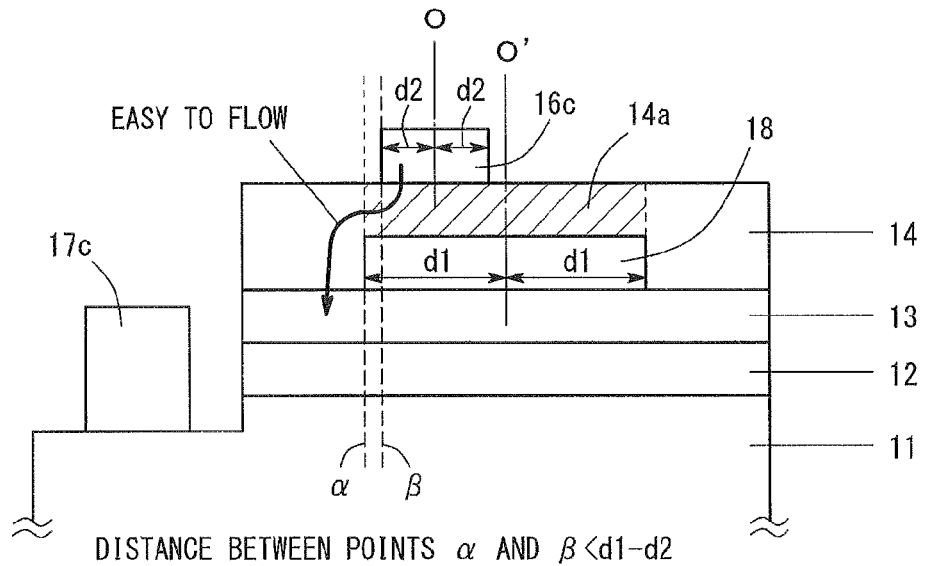
FIGS. 6A and 6B are views schematically showing the principle of the present invention.
Figure 6B:
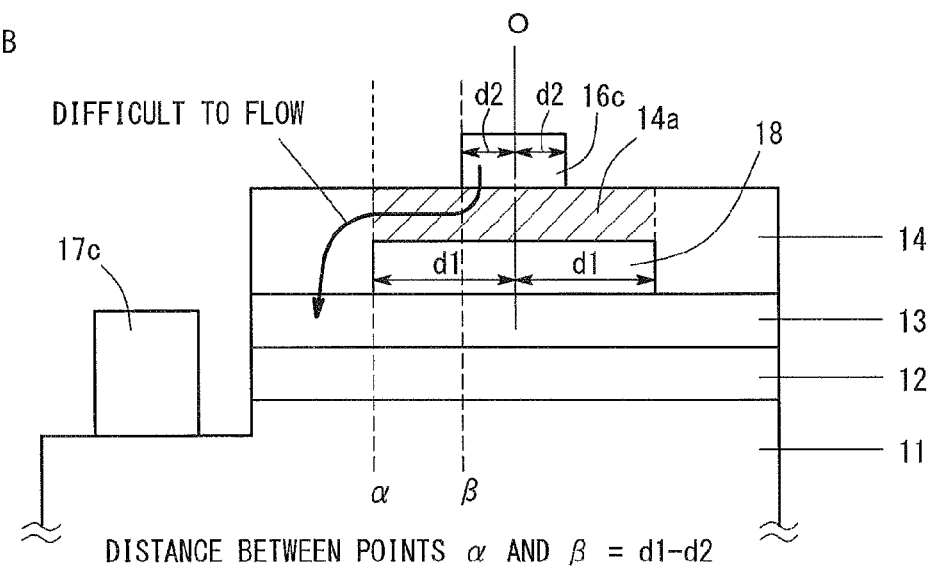

In the case where the center O of the width of the contact portion 16c in the direction of the straight line L is rendered coincident with the center O' of the width of the current blockage layer 18 in the direction of the straight line L, as shown in FIG. 6B, when the current from the contact portion 16c flows horizontally through the region 14a of the transparent electrode 14 and then flows toward the p-layer 13, the current flows through the region 14a over a longer distance, which makes it difficult for the current to flow. As a result, the drive voltage increases.

In view of the above, in the first embodiment, the center O' of the width of the current blockage layer 18 in the direction of the straight line L is located more remote from the contact portion 17c than is the center O of the width of the contact portion 16c in the direction of the straight line L. As a result, as shown in FIG. 6A, when the current from the contact portion 16c flows horizontally through the region 14a of the transparent electrode 14 toward the contact portion 17c and then flows toward the p-layer 13, the current flows through the region 14a over a shorter distance. Therefore, the current becomes less likely to be affected by the region 14a having a higher sheet resistance, and can flow more easily. As a result, an increase in the drive voltage is suppressed.

Notably, from the viewpoint of suppressing an increase in the drive voltage, the smaller the distance between points α and β shown in FIGS. 4 and 5, the better the results obtained. Namely, when the width of the current blockage layer 18 in the direction of the straight line L is represented by 2×d1 and the width of the current injection portion (the contact portion 16c in the first embodiment shown in FIGS. 1, 4, and 5 and the hole 21p in the modification shown in FIGS. 3A and 3B) in the direction of the straight line L is represented by 2×d2, the greater the amount by which the distance between points α and β is smaller than the value of d1−d2, the better the results obtained (see FIG. 1 through FIGS. 6A and 6B). The case where the distance between points α and β is equal to the value of d1−d2 is the case where the center O coincides with the center O', and the case where the distance between points α and β is smaller than the value of d1−d2 is the case where the center O' is located more remote from the contact portion 16c than is the center O (see FIGS. 6A). It is desired that the distance between points α and β be equal to or smaller than one half of the width of the contact portion 16c of the p-electrode 16, preferably, one half of the diameter of the contact portion 16c. It is most desired that the points α and β are rendered coincident to each other. The point α is one of two points where the straight line L intersects with the circumference of the current blockage layer 18, which point is closer to the contact portion 17c of the n-electrode 17. The point β is one of two points where the straight line L intersects with the circumference of the current injection portion (the contact portion 16c in the first embodiment shown in FIGS. 1, 4, and 5 and the hole 21p in the modification shown in FIGS. 3A and 3B), which point is closer to the contact portion 17c of the n-electrode 17.

Next, a method of manufacturing the light-emitting device of the first embodiment which is made of a group III nitride semiconductor will be described with reference to FIGS. 7A to 7C.

First, the substrate 10 mode of sapphire and having irregularities formed on the surface thereof was prepared, and thermally treated in a hydrogen atmosphere so as to remove impurities adhering to the surface.

Figure 7A:
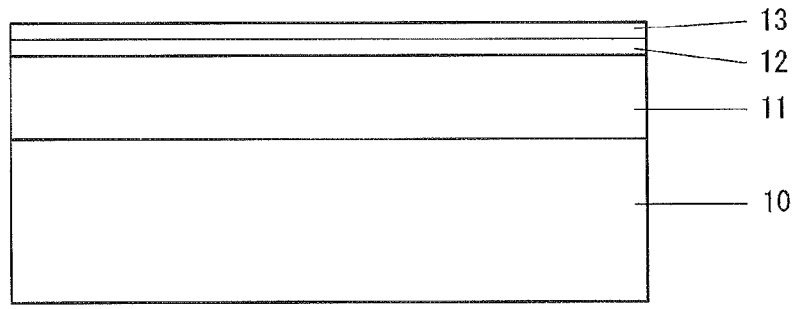
FIGS. 7A to 7C are views showing the steps of manufacturing the light-emitting device of the first embodiment.

Next, by using an MOCVD method, the n-layer 11, the light-emitting layer 12, and the p-layer 13 were successively deposited on the substrate 10 (FIG. 7A). TMG (trimethyl gallium) was used as a Ga source, TMA (trimethyl aluminum) was used as an Al source, a TMI (trimethyl indium) was used as an In source, ammonia was used as an N source, bis(cyclopentadienyl)magnesium was used as a p-type dopant gas, and shiran was used as an n-type dopant gas. Hydrogen and nitrogen were used as carrier gases.

Next, the current blockage layers 18 were formed on the p-layer 13. Specifically, a $SiO_2$ film was formed through vapor deposition or CVD, the formed $SiO_2$ film was patterned through photo lithography and wet etching, whereby the current blockage layers 18 were formed. The pattern formation may be performed through photo lithography, sputtering or vaper deposition, and lift-off. Each current blockage layer 18 was formed to have a circular pattern containing the circular planar pattern of the corresponding contact portion 16c of the p-electrode 16. Further, each current blockage layer 18 had a planar pattern determined such that, as compared with the center of the circle of the corresponding contact portion 16c, the center of the circle of the current blockage layer 18 was located more remote from the corresponding contact portion 17c of the n-electrode 17 subsequently formed inward in the short-side direction of the light-emitting device.

Figure 7B:
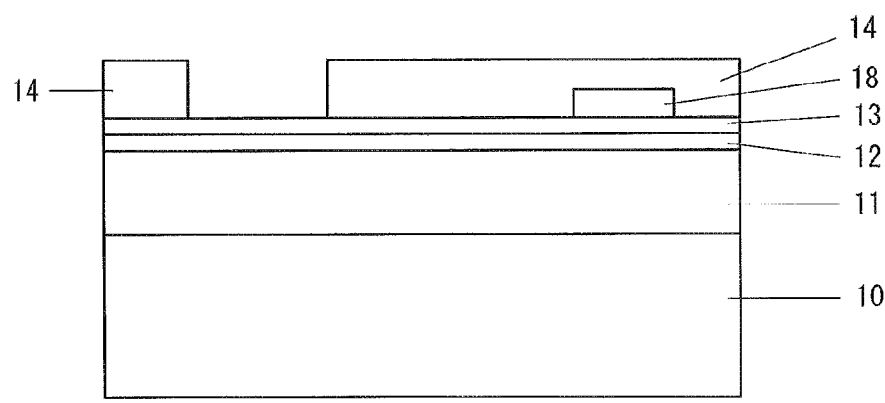
Figure 7C:
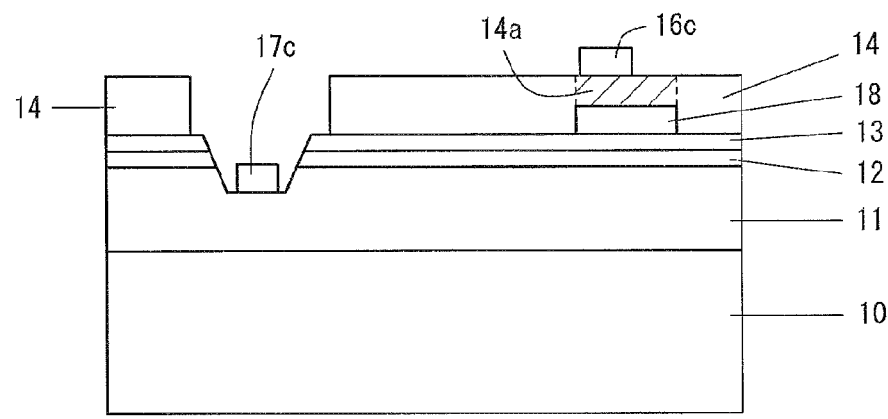

Next, the transparent electrode 14 was formed in a predetermined region on the p-layer 13 and the current blockage layers 18 (FIG. 7B). The transparent electrode 14 was formed by forming an IZO film through sputtering and patterning the formed IZO film through photo lithography and wet etching. The formed transparent electrode 14 was thermally treated at 650° C. for 5 minutes in vacuum, whereby the transparent electrode 14 was sintered so as to reduce its resistance.

Next, a predetermined region of the surface of the p-layer 13 was dry-etched so as to form a groove and expose the n-layer 11 at the bottom of the groove. The contact portions 16c of the p-electrode 16 were formed in predetermined regions on the transparent electrode 14, and the contact portions 17c of the n-electrode 17 were formed in predetermined regions on the n-layer 11 exposed at the bottom of the groove (see FIG. 7C). The contact portions 16c and 17c were formed (patterned) through photo lithography, vapor deposition, and lift-off. Although the contact portions 16c and the contact portions 17c may be formed separately, when the contact portions 16c and the contact portions 17c are made of the same material, the contact portions 16c and the contact portions 17c may be formed simultaneously. This can simplifies the manufacturing process and reduces the manufacturing cost. Subsequently, the contact portions 16c and 17c were thermally treated at 550° C. for five minutes in a pressure-reduced oxygen atmosphere of 15 Pa, whereby the contact portions 16c and 17c were alloyed.

As a result of the sintering of the transparent electrode 14 or the thermal or heat treatment for alloying the contact portions 16c and 17c, the sheet resistance of the region 14a of the transparent electrode 14 located above each current blockage layer 18 increases. The sheet resistance becomes 10 to 20 times as a result of the heat treatment for sintering the transparent electrode 14, and becomes 600 to 800 times as a result of the heat treatment for alloying. Conceivably, such an increase in the sheet resistance occurred because IZO forming the transparent electrode 14 captured oxygen originating from $SiO_2$ of the current blockage layer 18. Therefore, in the case where a transparent, electrically conductive oxide is used for the transparent electrode 14 and a transparent insulator including oxygen as a constituent element is used for the current blockage layers 18, it is considered that a similar phenomenon occurs and the sheet resistance of the transparent electrode 14 includes.

Next, the insulation film 15 was formed to cover the entire surface of the upper side. Subsequently, the reflection film 19 was formed over the entire surface, and photo lithography and etching were performed such that the insulation film 15 and the reflection film 19 have predetermined patterns. After that, the insulation film 15 was further formed over the entire surface, and predetermined regions of the insulation film 15 (regions located above the contact portions 16c and 17c) were dry-etched so as to form the holes 21p and 21n penetrating the insulation film 15. The contact portions 16c and 17c were exposed at the bottoms of the holes 21p and 21n. Subsequently, the wire bonding portion 16a and the wiring-like portions 16b of the p-electrode 16 and the wire bonding portion 17a and the wiring-like portion 17b of the n-electrode 17 were formed on the insulation film 15 through photo lithography, vapor deposition, and lift-off. The wiring-like portions 16b and 17b were formed to fill the interiors of the holes 21p and 21n such that the wiring-like portions 16b were connected to the contact portions 16c within the holes 21p, and the wiring-like portion 17b was connected to the contact portions 17c within the holes 21n. The reflection film 19 is present within the insulation film 15; specifically, in a lower region including the orthogonal projections of the wire bonding portion 16a and the wiring-like portions 16b of the p-electrode 16 and the wire bonding portion 17a and the wiring-like portion 17b of the n-electrode 17.

Next, the protection film was formed over the entire surface, excluding the wire bonding portions 16a and 17a, through CVD, photo lithography, and dry etching. The group III nitride semiconductor light-emitting device of the first embodiment shown in FIG. 1 was manufactured by the above-described method.

Second Embodiment

Figure 8:
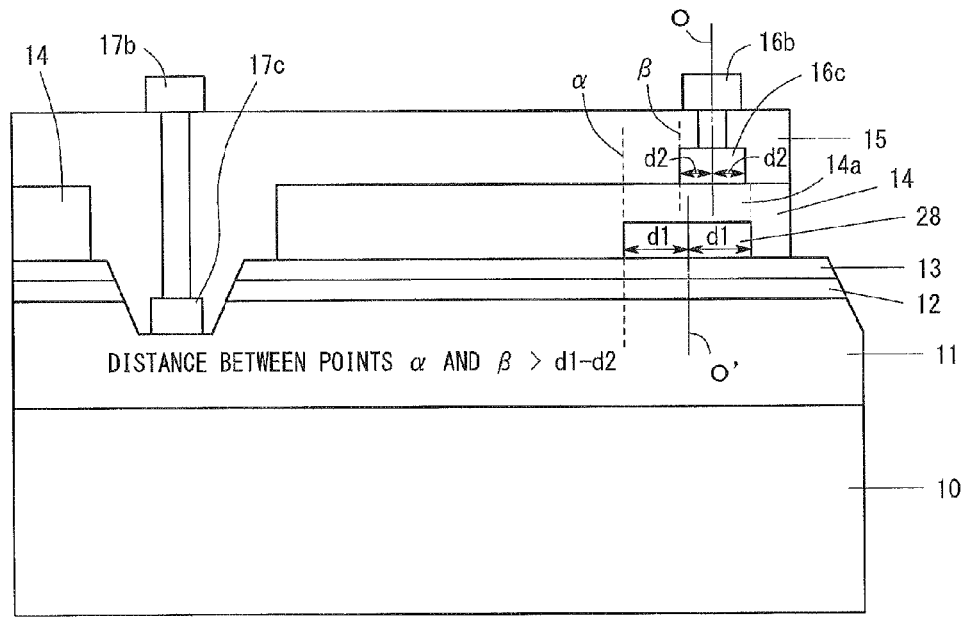
FIG. 8 is a cross-sectional view showing the structure of a light-emitting device of a second embodiment.

FIG. 8 is a cross-sectional view of a light-emitting device of a second embodiment which is made of a group III nitride semiconductor. The light-emitting device of the second embodiment has current blockage layers 28 in place of the current blockage layers 18 of the light-emitting device of the first embodiment. The current blockage layers 28 have a planar pattern different from that of the current blockage layers 18 of the light-emitting device of the first embodiment. Other structural elements are the same as those of the light-emitting device of the first embodiment.

Figure 9:
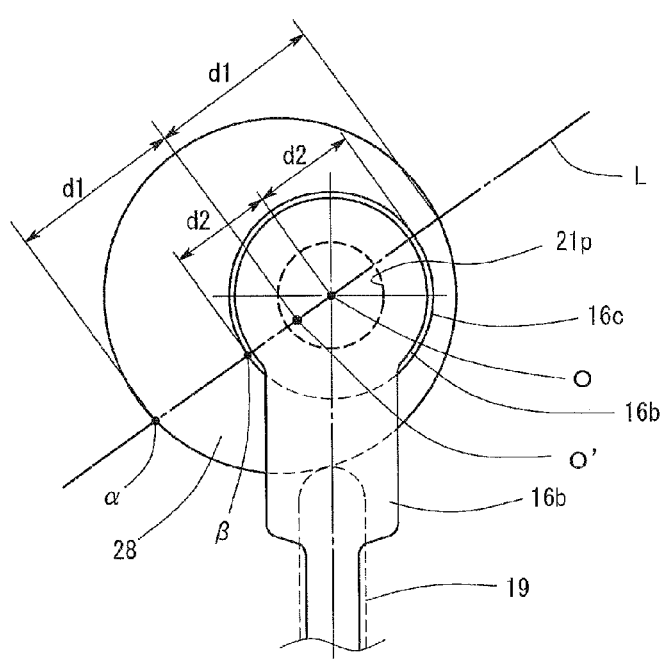
FIG. 9 is an enlarged view of a portion of the light-emitting device of the second embodiment, the portion including a contact portion 16c.

FIG. 9 is an enlarged view of a contact portion 16c of the light-emitting device of the second embodiment as viewed from the upper side. As shown in FIGS. 8 and 9, each current blockage layer 28 has a circular planar pattern which contains a corresponding contact portion 16c in plan view. Also, when the straight line L is defined in the same manner as in the first embodiment, the center O' of the width of the current blockage layer 28 in the direction of the straight line L is located closer to the closest contact portion 17c than is the center O of the width of the contact portion 16c in the direction of the straight line L.

In the case where the current blockage layer 28 has such a planar pattern, when the current from the contact portion 16c flows horizontally through the region 14a of the transparent electrode 14 toward the contact portion 17c and then flows toward the p-layer 13, the current flows through the region 14a over a longer distance, and it becomes difficult for the current to flow. Meanwhile, the current flowing toward the side opposite the contact portion 17c flows through the region 14a over a shorter distance, and it becomes easier for the current to flow. Therefore, the current on the contact portion 17c side, which current has been conventionally large, decreases, and the current on the side opposite the contact portion 17c, which current has been conventionally small, increases, whereby the current distribution becomes uniform, and the uniformity of light emission is improved.

Notably, the greater the distance between points α and β shown in FIGS. 8 and 9, the grater the degree of uniformity of the current distribution. Namely, when d1 and d2 are defined in the same manner as in the first embodiment, the greater the amount by which the distance between points α and β is larger than the value of d1–d2, the better the results obtained (FIGS. 8 and 9). The case where the distance between the points α and β is larger than the value of d1–d2 is the case where the center O' is located closer to the contact portion 16c than is the center O (see FIGS. 8 and 9). It is desired that the distance between the points α and β be equal to or greater than ½ of the diameter of the contact portion 16c. The points α and β are defined in the same manner as in the first embodiment.

Third Embodiment

Figure 10:
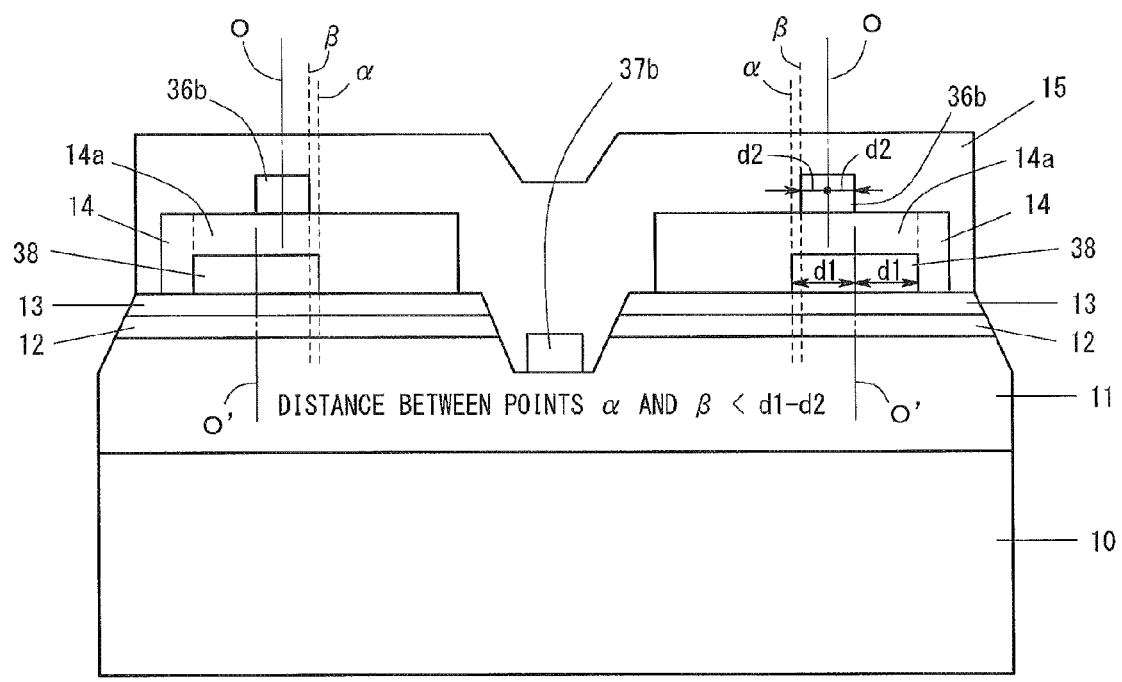
FIG. 10 is a cross-sectional view showing the structure of a light-emitting device of a third embodiment.
Figure 11:
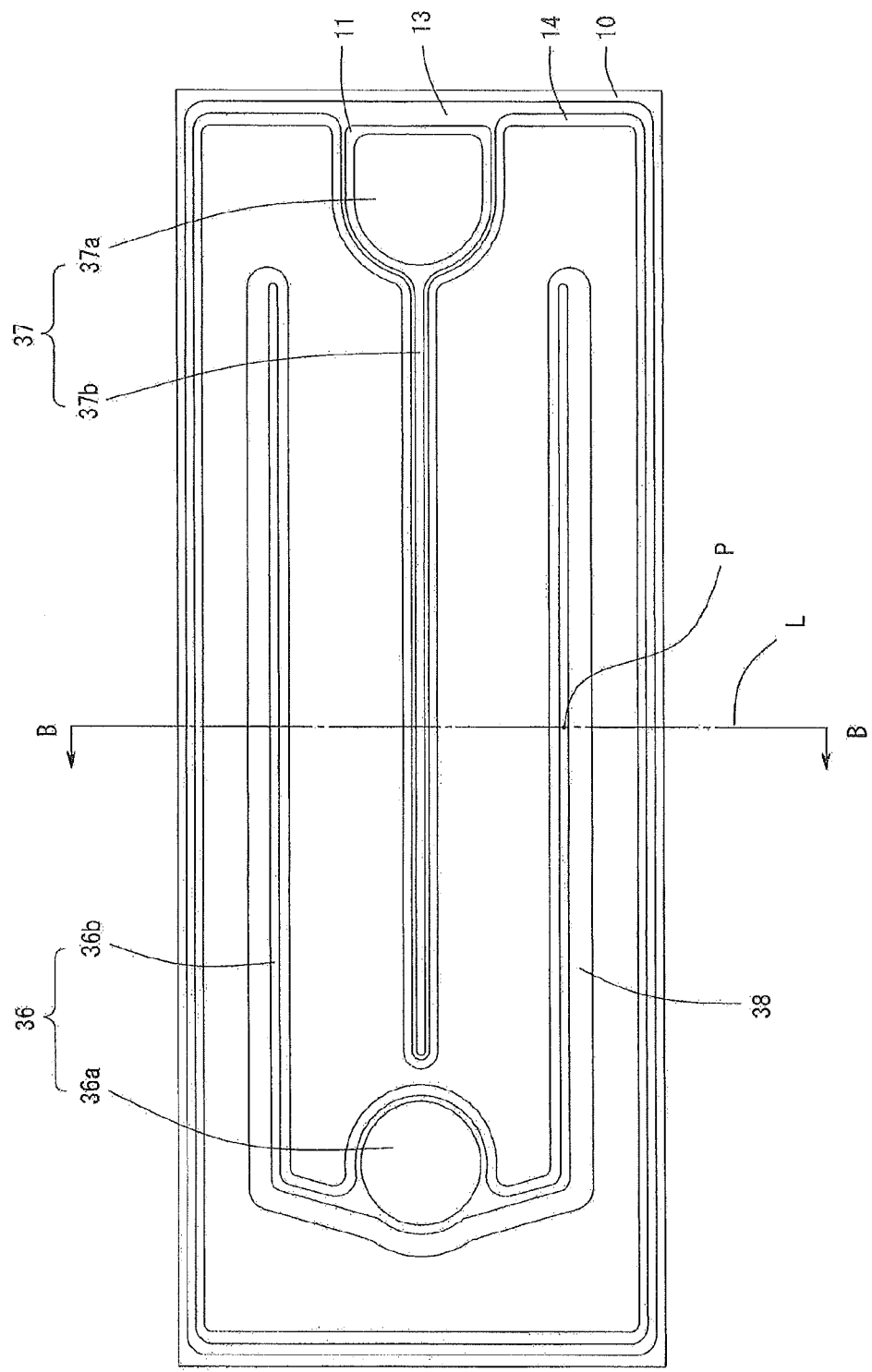
FIG. 11 is a plan view of the light-emitting device of the third embodiment as viewed from the upper side thereof.

FIG. 10 is a cross-sectional view of a light-emitting device of a third embodiment which is made of a group III nitride semiconductor. FIG. 11 is a plan view of the light-emitting device of the third embodiment as viewed from the upper side. FIG. 10 is a cross-sectional view taken along line B-B in FIG. 11. The line B-B is parallel to the direction of the short sides of the light-emitting device. As shown in FIG. 10, the light-emitting device of the third embodiment is a face-up device having a rectangular shape in plan view. In FIGS. 10 and 11, structural portions identical with those of the light-emitting device of the first embodiment are denoted by the same reference numerals.

As shown in FIG. 10, the light-emitting device of the third embodiment differs from the light-emitting device of the first embodiment in the structure on the transparent electrode 14. The light-emitting device of the first embodiment has a structure in which the insulation film 15 is provided on the transparent electrode 14 and the p-electrode 16 is provided on the insulation film 15. In contrast, in the light-emitting device of the third embodiment, a p-electrode 36 is provided directly on the transparent electrode 14. Also, an n-electrode 37 is provided directly on the n-layer 11. Also, in place of the current blockage layers 18, a current blockage layer 38 is provided. The current blockage layer 38 is the same as the current blockage layers 18 except for its planar pattern.

As shown in FIG. 11, the p-electrode 36 which is provided on the transparent electrode 14 and is in contact with the transparent electrode 14 has a wire bonding portion 36*a* and wiring-like portions 36*b*, which have the same planar patterns as the wire bonding portion 16*a* and the wiring-like portions 16*b* of the first embodiment. As shown in FIG. 11, the n-electrode 37 which is provided on the n-layer 11 and is in contact with the n-layer 11 has a wire bonding portion 37*a* and a wiring-like portion 37*b*, which have the same planar patterns as the wire bonding portion 17*a* and the wiring-like portion 17*b* of the first embodiment. The entirety of the p-electrode 36 corresponds to the p-side current injection portion of the present invention, and the entirety of the n-electrode 37 corresponds to the n-side current injection portion of the present invention.

The current blockage layer 38 is provided between the p-layer 13 and the transparent electrode 14. The planar pattern of the current blockage layer 38 is a pattern obtained through similarity enlargement of the p-electrode 36 and containing the p-electrode 36. Also, when the straight line L is defined in the same manner as in the first embodiment, the center O' of the width of the current blockage layer 38 in the direction of the straight line L is located more remote from the n-electrode 37 than is the center O of the width of the p-electrode 36 in the direction of the straight line L. Also, like the first embodiment, a region of the transparent electrode 14 located above the current blockage layer 38 is the region 14*a* whose sheet resistance is higher than that of the remaining region.

A specific example of the straight line L will be described for the case where the intersection P between the line B-B and one wiring-like portion 36*b* is selected. In this case, the shortest straight line L between the point P and the n-electrode 37 (the wiring-like portion 37*b*) coincides with a straight line parallel to the short sides of the light-emitting device; i.e., the line B-B. This is because the wiring-like portions 36*b* and the wiring-like portion 37*b* are parallel to the direction of the long sides of the light-emitting device.

When the current blockage layer 38 is formed as described above, the same effect as the first embodiment can be obtained. Namely, since the center O' of the width of the current blockage layer 38 in the direction of the straight line L is located more remote from the wiring-like portion 37*b* of the n-electrode 37 than is the center O of the width of the wiring-like portion 36*b* of the p-electrode 36 in the direction of the straight line L, when the current from each wiring-like portion 36*b* of the p-electrode flows horizontally through the region 14*a* of the transparent electrode 14 toward the wiring-like portion 37*b* of the n-electrode 37 and then flows toward the p-layer 13, the current flows through the region 14*a* over a shorter distance. Therefore, the current is less likely to be affected by the region 14*a* having a high sheet resistance and flows more easily. As a result, an increase in the drive voltage is suppressed.

As in the case of the first embodiment, the smaller the distance between points α and β shown in FIG. 10, the grater the degree to which an increase in the drive voltage can be suppressed. Namely, when d1 and d2 are defined in the same manner as in the first embodiment, the greater the amount by which the distance between points α and β is smaller than the value of d1−d2, the better the results obtained (see FIG. 10). It is desired that the distance between points α and β be equal to or smaller than one half of the width of the wiring-like portion 36*b* which serves as a contact portion. It is most desired that the points α and β are rendered coincident to each other. The points α and β are defined in the same manner as in the first embodiment.

Notably, in the third embodiment, when the center O' of the current blockage layer 38 in the direction of the straight line L is located closer to the wiring-like portion 37*b* of the n-electrode 37 than is the center O of the wiring-like portion 36*b* of the p-electrode 36 in the direction of the straight line L, an effect similar to the effect of the second embodiment can be obtained. Namely, the uniformity of light emission can be improved. In this case, as in the second embodiment, the greater the distance between points α and β, the better the results obtained. Namely, the greater the amount by which the distance between points α and β is larger than the value of d1−d2, the better the results obtained. It is desired that the distance between the points α and β be equal to or greater than one half of the width of the wiring-like portion 36*b* which serves as a contact portion.

Fourth Embodiment

Figure 12:
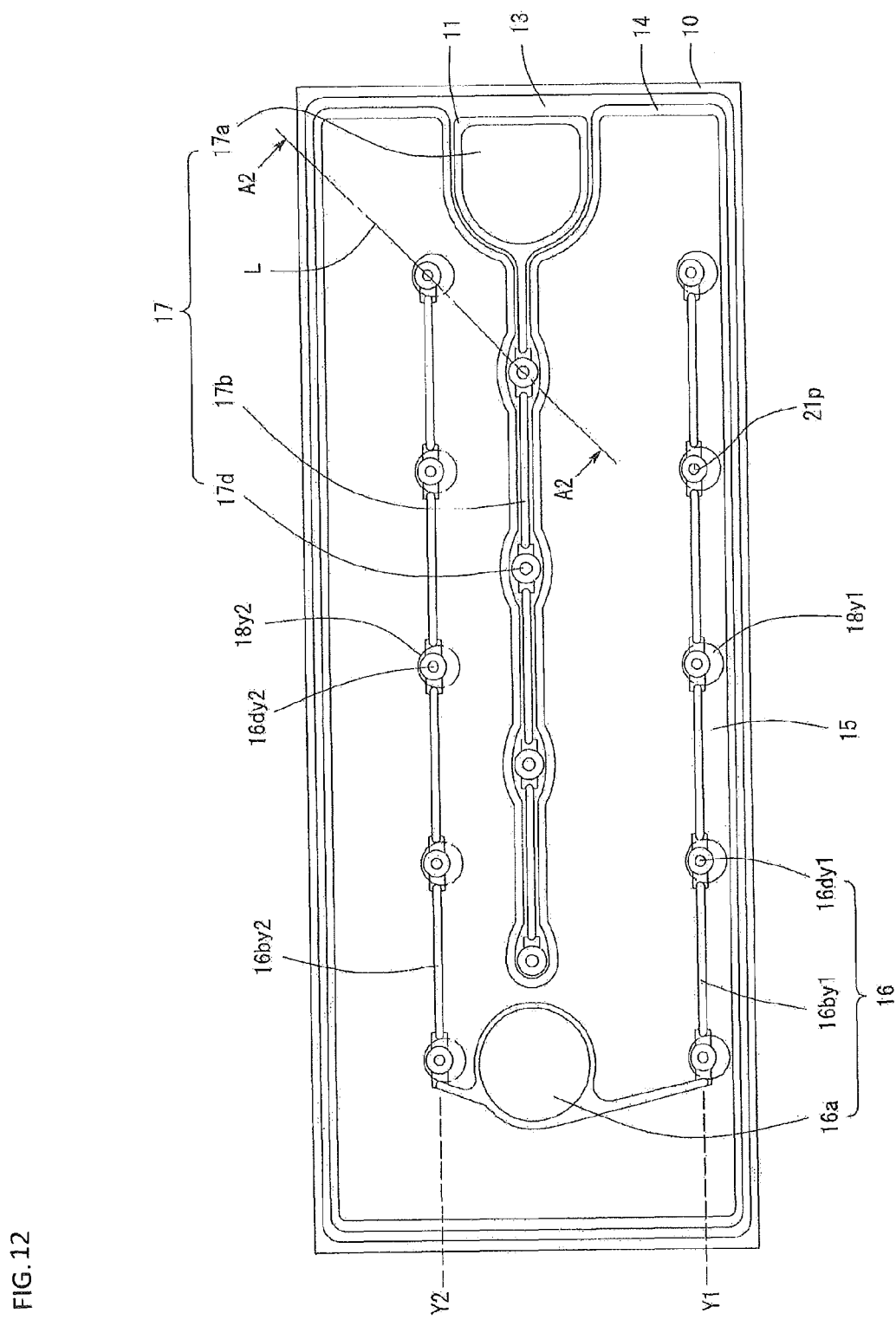
FIG. 12 is a plan view of a light-emitting device of a fourth embodiment as viewed from the upper side thereof.
Figure 13:
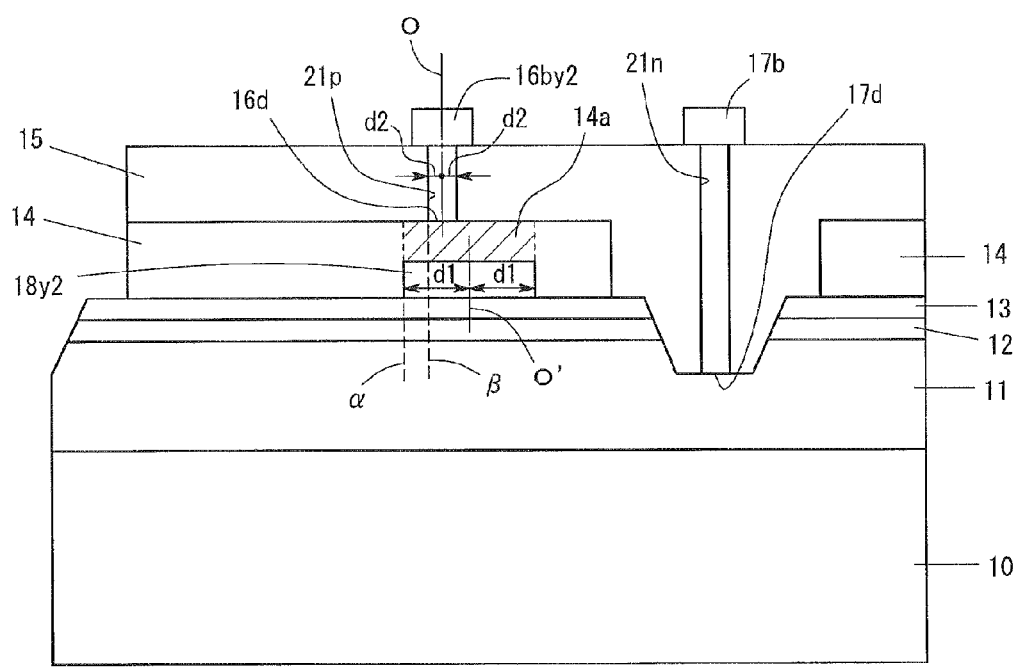
FIG. 13 is a cross-sectional view showing the structure of the light-emitting device of the fourth embodiment.

A light-emitting device of a fourth embodiment is an example in which the first embodiment (the center O' of the width of each current blockage layer 18 in the direction of the straight line L is located more remote from the closest contact portion 17*c* of the n-electrode 17 than is the center O of the width of the corresponding contact portion 16*c* (the corresponding hole 21*p* in the modification of FIG. 3A having no contact portion 16*c*) in the direction of the straight line L) is combined with the second embodiment (the center O' of the width of each current blockage layer 28 is located closer to the closest contact portion 17*c* of the n-electrode 17 than is the center O). The structure of the light-emitting device of the fourth embodiment is shown in FIG. 12 and FIG. 13 which is a cross-sectional view taken along line A2-A2 of FIG. 12. These drawings show an example in which the contact portions 16*c* and 17*c* are not provided, and each wiring-like portion 16*b* is joined directly to the transparent electrode 14 through the holes 21*p*, and the wiring-like portion 17*b* is joined directly to the contact layer of the n-layer 11 through the holes 21*n*. Their joint portions function as the contact portions 16*c* and 17*c*. Therefore, in all the following embodiments, the joint portions between the wiring-like portion 16*b* and the transparent electrode 14 and the joint portions between the wiring-like portion 17*b* and the contact layer of the n-layer 11 will be referred to as "contact portions."

A straight wiring-like portion 16*b*y1 of the p-electrode 16 located on a line Y1 employs the structure of the first embodiment, and a straight wiring-like portion 16*b*y2 of the p-electrode 16 located on a line Y2 employs the structure of the second embodiment. As compared with the wiring-like portion 16*b*y1 on the line Y1, the wiring-like portion 16*b*y2 on the line Y2 is closer to the straight wiring-like portion 17*b* (of the n-electrode 17) extending from a central portion of a short side of the chip in parallel to the long sides thereof. Accordingly, the distance of the first path between each contact portion 16*d*y1 of the wiring-like portion 16*b*y1 on the line Y1 and the closest contact portion 17*d* of the wiring-like portion 17*b* of the n-electrode 17 is greater than the distance of the second path between each contact portion 16*d*y2 of the wiring-like portion 16*b*y2 on the line Y2 and the closest contact portion 17*d* of the wiring-like portion 17*b* of the n-electrode 17. Therefore, the resistance of the first path is larger than that of the second path.

In order to realize uniform current distribution on the surface, the center O' of the width of a current blockage layer 18y1 on the line Y1 is located more remote from the wiring-like portion 17b at the chip central portion, as compared with the center O of the width of the contact portion 16dy1 of the wiring-like portion 16by1, whereby the current path on the current blockage layer 18y1 toward the contact portion 17d is shortened, and the resistance of the first path is decreased. Also, the center O' of the width of a current blockage layer 18y2 on the line Y2 is located closer to the wiring-like portion 17b at the chip central portion, as compared with the center O of the width of the contact portion 16dy2 of the wiring-like portion 16by2. As a result, in the second path which is low in resistance, the resistance of the path on the current blockage layer 18y2 is increased. In contrast, the resistance on the current blockage layer 18y2 in the path on the current blockage layer 18y2 toward a long side of the chip is decreased as in the case of the second embodiment. As a result, even in the case where the straight wiring-like portion 16by1 and wiring-like portion 16by2 parallel to the long sides of the chip are disposed asymmetrically with respect to the mid points of the short sides of the chip, the current density distribution on the surface of the chip; i.e., the planar density distribution of the current vertically flowing through the light-emitting layer 12, can be made more even and uniform. As a result, the intensity of emitted light can be made uniform and even on the surface.

Notably, the light-emitting device of the present embodiment may have the contact portions 16c and 17c shown in FIG. 1 (the first embodiment) and FIG. 8 (the second embodiment).

Fifth Embodiment

A light-emitting device of a fifth embodiment is an example in which the structure of the third embodiment shown in FIG. 11 is employed and the wiring-like portions of the p-electrode of the fourth embodiment are disposed asymmetrically with respect to the midpoints of the short sides of the chip.

Figure 14:
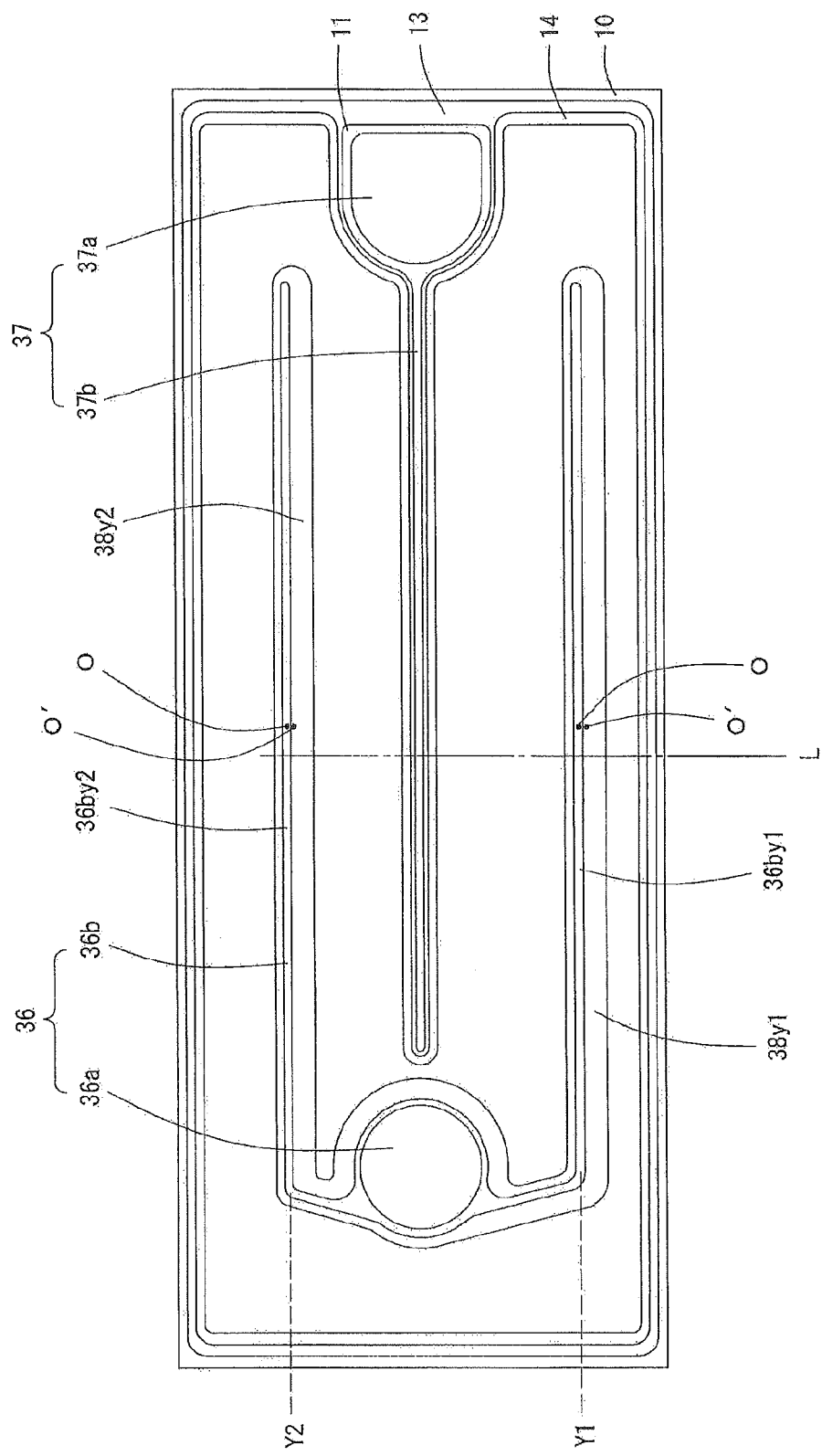
FIG. 14 is a plan view of a light-emitting device of a fifth embodiment as viewed from the upper side thereof.

As shown in FIG. 14, the light-emitting device of the fifth embodiment is an example in which the first embodiment (the center O' of the width (parallel to the chip short sides) of a straight current blockage layer 38y1, extending parallel to the chip long sides, in the direction of the straight line L is located more remote from the wiring-like portion 37b of the n-electrode 37 than is the center O of the width of a straight wiring-like portion 36by1, extending parallel to the chip long sides, in the direction of the straight line L) is combined with an example in which the center O' of the width of a current blockage layer 38y2 is located closer to the wiring-like portion 37b of the n-electrode 37 than is the center O of the width of the wiring-like portion 36by2.

For the straight wiring-like portion 36by1 of the p-electrode 36 located on the line Y1, the structure of the third embodiment is employed. As compared with the wiring-like portion 36by1 on the line Y1, the straight wiring-like portion 36by2 on the line Y2 is closer to the straight wiring-like portion 37b (of the n-electrode 37) extending from the central portion of a short side of the chip in parallel to the long sides of the chip. Therefore, the distance of the first path between the wiring-like portion 36by1 on the line Y1 which is joined directly to the transparent electrode 14 and the straight wiring-like portion 37b joined directly to the n contact layer of the n-layer 11 is greater than the distance of the second path between the wiring-like portion 36by2 on the line Y2 and the wiring-like portion 37b of the n-electrode 37. Therefore, the resistance of the first path is greater than the resistance of the second path.

In order to realize uniform current distribution on the surface, the center O' of the width of a current blockage layer 38y1 on the line Y1 is located more remote from the wiring-like portion 37b at the chip central portion, as compared with the center O of the width of the wiring-like portion 36by1, whereby the current path on the current blockage layer 38y1 toward the wiring-like portion 37b is shortened, and the resistance of the first path is decreased. Also, the center O' of the width of a current blockage layer 38y2 on the line Y2 is located closer to the wiring-like portion 37b at the chip central portion, as compared with the center O of the width of the wiring-like portion 36by2. As a result, in the second path which is low in resistance, the resistance of the path on the current blockage layer 38y2; specifically, the resistance of the current path toward the wiring-like portion 37b, is increased. In contrast, the resistance on the current blockage layer 38y2 in the current path on the current blockage layer 38y2 toward a long side of the chip is decreased as in the case of the second embodiment. As a result, even in the case where the straight wiring-like portion 36by1 and wiring-like portion 36by2 parallel to the long sides of the chip are disposed asymmetrically with respect to the mid points of the short sides of the chip, the current density distribution on the surface of the chip; i.e., the planar density distribution of the current vertically flowing through the light-emitting layer 12, can be made more even and uniform. As a result, the intensity of emitted light can be made uniform and even on the surface.

Sixth Embodiment

A light-emitting device of a sixth embodiment has a structure in which the structure of the first embodiment and the structure of the second embodiment are combined in the chip long-side direction.

Figure 15:
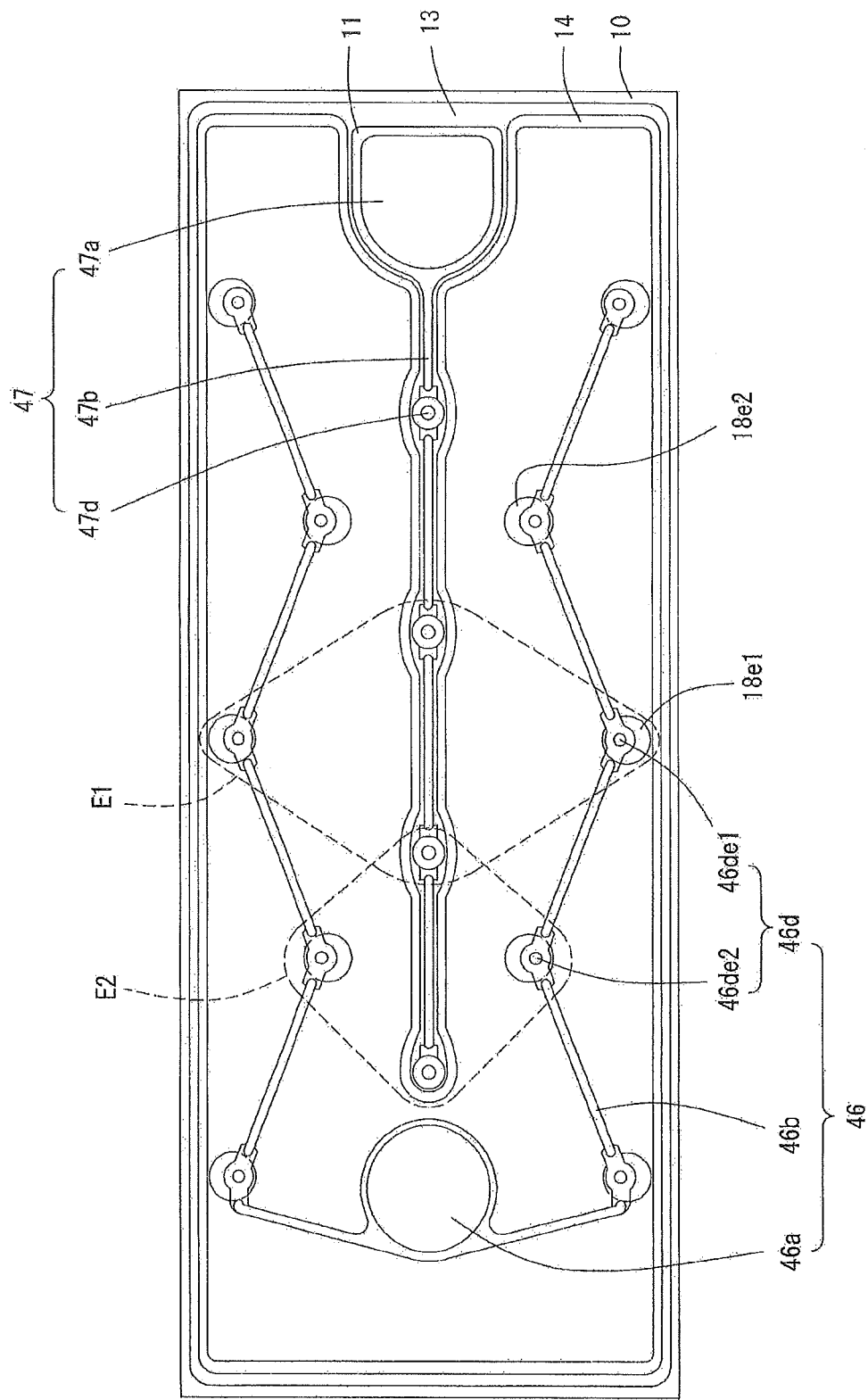
FIG. 15 is a plan view of a light-emitting device of a sixth embodiment as viewed from the upper side thereof.

As shown in FIG. 15, in the light-emitting device of the present embodiment, each wiring-like portion 46b of the p-electrode is formed into a wavy shape such that the wiring-like portion 46b has a region E1 in which the distance between a contact portion 46d and a contact portion 47d of a wiring-like portion 47b of an n-electrode 47 extending at the central portions of the short sides of the chip in parallel to the long sides thereof (hereinafter referred to as the "inter p-n contact portion distance") is long and a region E2 in which the inter p-n contact portion distance is short alternately appear in the chip long-side direction. The present embodiment is an example in which the contact portions 16c and 17c as shown in FIG. 1 are not provided, and each wiring-like portion 46b is joined directly to the transparent electrode 14 through the holes 21p as shown in FIG. 3A, and the wiring-like portion 47b is joined directly to the contact layer of the n-layer 11 through the holes 21n as shown in FIG. 3A. Their joint portions function as the contact portions 16c and 17c. Therefore, the joint portions between the wiring-like portion 46b and the transparent electrode 14 will be referred to as "contact portions 46de1 and 46de2, and the joint portions between the wiring-like portion 47b and the contact layer of the n-layer 11 will be referred to as a "contact portion 47d."

In the region E1 in which the inter p-n contact portion distance is large, the structure of the first embodiment is used, and in the region E2 in which the inter p-n contact portion distance is small, the structure of the second embodiment is used. The first path which is the shortest path between the contact portion 46*de*1 of the wiring-like portion 46*b* and the contact portion 47*d* of the wiring-like portion 47*b* in the region E1 is longer than the second path which is the shortest path between the contact portion 46*de*2 of the wiring-like portion 46*b* and the contact portion 47*d* of the wiring-like portion 47*b* in the region E2. Therefore, the resistance of the first path is greater than the resistance of the second path.

In order to realize uniform current distribution on the surface, the center O' of the width of a current blockage layer 18*e*1 in the region E1 is located more remote from the wiring-like portion 47*b* at the chip central portion, as compared with the center O of the width of the contact portion 46*de*1 of the wiring-like portion 46*b*, whereby the current path on the current blockage layer 18*e*1 toward the contact portion 47*d* is shortened, and the resistance of the first path is decreased. Also, in region E2, the center O' of the width of a current blockage layer 18*e*2 is located closer to the wiring-like portion 47*b* at the chip central portion, as compared with the center O of the width of the contact portion 46*de*2 of the wiring-like portion 46*b*. As a result, in the second path which is low in resistance, the resistance of the current path on the current blockage layer 18*e*2 toward the contact portion 47*d* is increased. In contrast, the resistance on the current blockage layer 18*e*2 in the path on the current blockage layer 18*e*2 toward a long side of the chip, is decreased as in the case of the second embodiment. As a result, the current density distribution on the surface of the chip; i.e., the planar density distribution of the current vertically flowing through the light-emitting layer 12, can be made more even and uniform. As a result, the intensity of emitted light can be made uniform and even on the surface.

Notably, the light-emitting device of the present embodiment may have the contact portions 16*c* and 17*c* shown in FIG. 1 (the first embodiment) and FIG. 8 (the second embodiment).

Seventh Embodiment

Figure 16:
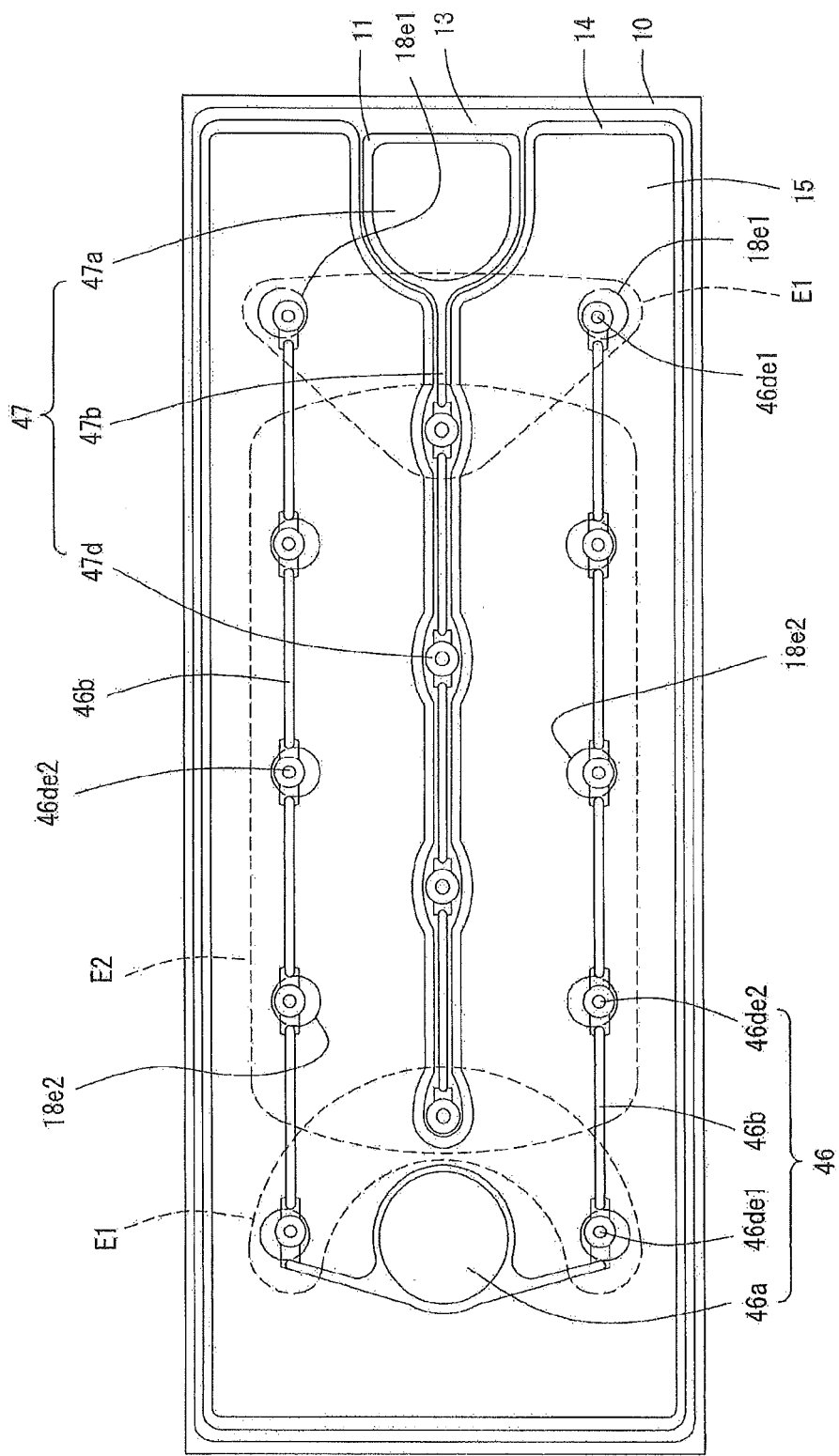
FIG. 16 is a plan view of a light-emitting device of a seventh embodiment as viewed from the upper side thereof.

In the present embodiment, the structure of the first embodiment is used for the four end portions of the wiring-like portions of the p-electrode, and the structure of the second embodiment is used for other regions. As shown in FIG. 16, in a region E2 at a chip central portion, for each single contact portion 46*de*2 of each wiring-like portion 46*b* of the p-electrode 48, there exist two contact portions 47*d* of the n-electrode 47 which are closest thereto. Meanwhile, for each single contact portion 46*de*1 of the p-electrode 46 present in each of the regions E1 at the four corners of the chip, there exists a single contact portion 47*d* of the n-electrode 47 which is closest thereto. Accordingly, the resistance of the second path between one contact portion 46*de*2 of the p-electrode 46 in the region E2 and the corresponding contact portion 47*d* of the n-electrode 47 is small. In contrast, the resistance of the first path between one contact portion 46*de*1 of the p-electrode 46 in the region E1 and the corresponding contact portion 47*d* of the n-electrode 47 is large.

In order to realize uniform current distribution on the surface, the center O' of the width of a current blockage layer 18*e*1 in the region E1 is located more remote from the closest contact portion 47*d* at the chip central portion, as compared with the center O of the width of the contact portion 46*de*1 of the wiring-like portion 46*b*, whereby the current path on the current blockage layer 18*e*1 toward the contact portion 47*d* is shortened, and the resistance of the first path is decreased. Also, in region E2, the center O' of the width of a current blockage layer 18*e*2 is located closer to the wiring-like portion 47*b* at the chip central portion, as compared with the center O of the width of the contact portion 46*de*2 of the wiring-like portion 46*b*. As a result, in the second path which is low in resistance, the resistance of the current path on the current blockage layer 18*e*2 toward the contact portion 47*d* is increased. In contrast, the resistance of the path on the current blockage layer 18*e*2 toward a long side of the chip, is decreased as in the case of the second embodiment. As a result, the current density distribution on the surface of the chip; i.e., the planar density distribution of the current vertically flowing through the light-emitting layer 12, can be made more even and uniform. As a result, the intensity of emitted light can be made uniform and even on the surface.

Notably, the light-emitting device of the present embodiment may have the contact portions 16*c* and 17*c* shown in FIG. 1 (the first embodiment) and FIG. 8 (the second embodiment).

Eighth Embodiment

Figure 17:
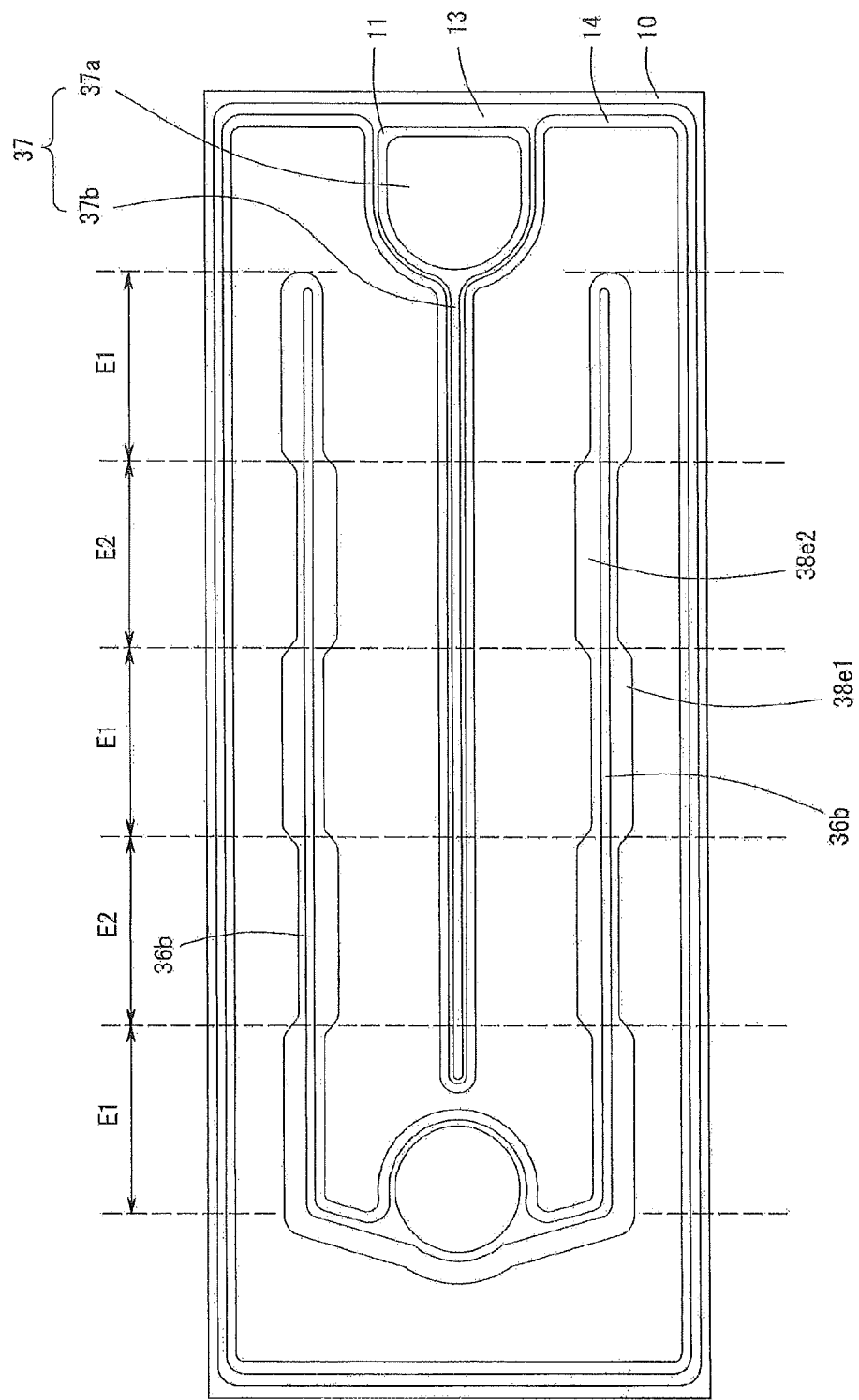
FIG. 17 is a plan view of a light-emitting device of a eighth embodiment as viewed from the upper side thereof.

An eighth embodiment is shown in FIG. 17. A light-emitting device of the eighth embodiment has a structure in which the structure of the third embodiment shown in FIG. 11 is employed and in which the positional relation between the current blockage layer and the contact portions of the p-electrode changes periodically. Portions which have the same functions as those shown in FIG. 11 are denoted by the same reference numerals. The straight wiring-like portions 36*b* of the p-electrode 36 which extend parallel to the long sides of the chip are disposed symmetrically with respect to the midpoints of the short sides of the chip. In the region E1, the center O' of the width of the current blockage layer 38*e*1 is located more remote from the wiring-like portion 37*b* at the chip central portion, as compared with the center O of the width of the wiring-like portion 36*b*. Meanwhile, in the region E2, the center O' of the width of the current blockage layer 38*e*2 is located closer to the wiring-like portion 37*b* at the chip central portion, as compared with the center O of the width of the wiring-like portion 36*b*. The regions E1 and E2 are alternately disposed in the chip long-side direction. The region E1 is set at each of the four corners of the chip.

When such a structure is employed, in the region E1, the path on the current blockage layer 38*e*1 which extends from the wiring-like portion 36*b* toward the wiring-like portion 37*b* at the chip central portion can be shorted so as to decrease the resistance thereof. Meanwhile, in the region E2, the path on the current blockage layer 38*e*2 which extends from the wiring-like portion 36*b* toward the wiring-like portion 37*b* at the chip central portion can be extended so as to increase the resistance thereof. In contrast, the resistance on the current blockage layer 38*e*2 in the path on the current blockage layer 38*e*2 toward a long side of the chip is decreased as in the case of the second embodiment. As described above, the region E1 where the density of the current flowing toward the wiring-like portion 37*b* of the n-electrode 37 is increased and the region E2 where the density of the current flowing toward a long side of the chip is increased are mixedly provided. The planar density distribution of the current flowing vertically in the light-emitting layer 12 can be made more even and uniform. As a result, the intensity of emitted light can be made uniform and even on the surface. At the four corners of the chip, the density of current flowing between the wiring-like portion 36*b* and the wiring-like portion 37*b* at the chip central portion becomes smaller as compared with that at the central portion. Therefore, each of the regions at the four corners is preferably the region E1.

As can be understood from the descriptions of many embodiments including the first through eighth embodiments, the object of the present invention is to suppress an increase in the drive voltage and to make uniform the light emission distribution on the surface of the chip. Accordingly, the ideas of the above-describe embodiments may be combined to realize the following embodiments.

For each p-side current injection portion, the positional deviation between the center O' of the current blockage layer and the center O of the p-side current injection portion and the direction of the positional deviation are determined in order to obtain a planar light emission distribution which is more uniform than the planar light emission distribution obtained when the center O of the p-side current injection portion and the center O' of the current blockage layer are rendered coincident with each other. Namely, for the p-side current injection portion from which current flows in such a manner that the density of the current flowing from the p-side current injection portion toward the closest n-side current injection portion is larger than the density of the current flowing from the p-side current injection portion toward a long side of the chip when the center O' and the center O are rendered coincident with each other, the structure of the second embodiment in which the center O' is located closer to the n-side current injection portion than is the center O is employed. In contrast, for the p-side current injection portion from which current flows in such a manner that the density of the current flowing from the p-side current injection portion toward the closest n-side current injection portion is smaller than the density of the current flowing from the p-side current injection portion toward a long side of the chip, the structure of the first embodiment in which the center O' is located more remote to the n-side current injection portion than is the center O is employed.

The above-described structures can decrease the drive voltage and can improve the uniformity of the light emission distribution.

Also, the fourth through eighth embodiments are examples in which the layout in which the center O' of the width of the current blockage layer in the direction of the straight line L is located more remote from the n-side current injection portion in the direction of the straight line L than is the center O of the width of the p-side current injection portion in the direction of the straight line L and the layout in which the center O' of the width of the current blockage layer in the direction of the straight line L is located closer to the n-side current injection portion in the direction of the straight line L than is the center O of the width of the p-side current injection portion in the direction of the straight line L are mixedly present.

Also, the fourth and sixth embodiments are examples of the following specific case. Specially, in the case where the distance between a p-side current injection portion and an n-side current injection portion closest to that p-side current injection portion assumes one of a plurality of values between a maximum distance and a minimum distance, one half of the sum of the maximum distance and the minimum distance is employed as an average distance. For p-side current injection portions ($16dy1$, $46de1$) whose distance to the closest n-side current injection portion is between the maximum distance and the average distance, there is employed the layout in which the center O' of the width of the current blockage layer in the direction of the straight line L is located more remote from the n-side current injection portion in the direction of the straight line L, as compared with the center O of the width of the p-side current injection portion in the direction of the straight line L. For p-side current injection portions ($16dy2$, $46de2$) whose distance to the closest n-side current injection portion is between the minimum distance and the average distance, there is employed the layout in which the center O' of the width of the current blockage layer in the direction of the straight line L is located closer to the n-side current injection portion in the direction of the straight line L, as compared with the center O of the width of the p-side current injection portion in the direction of the straight line L. In the case where the p-side current injection portions are randomly disposed in the structure as shown in FIG. 15, the distance to the closest n-side current injection portion may change among various values. Therefore, in such a case, the p-side current injection portions may be divided into two groups on the basis of the distance, and the layout of the first embodiment and the layout of the second embodiment may be mixedly employed for the two groups.

Modifications:

All the light-emitting devices of the first through eighth embodiments are face-up-type devices. However, the present invention is not limited to the face-up-type devices, and may be applied to flip-chip-type devices.

Also, the various modifications shown in the first embodiment may be employed in other embodiments.

The light-emitting device of the present invention can be used for lighting apparatuses, display apparatuses, etc.

What is claimed is:

1. A light-emitting device comprising:
   an n-layer, a light-emitting layer, and a p-layer which are semiconductor layers each made of a group III nitride semiconductor and are deposited in this order;
   a transparent electrode which is located on the p-layer and is made of a transparent, electrically conductive oxide;
   at least one p-side current injection portion which is located on the transparent electrode and in contact with the transparent electrode;
   at least one n-side current injection portion connected to the n-layer; and
   a current blockage layer which is made of an insulator and is disposed between the p-layer and the transparent electrode to be located below the p-side current injection portion, wherein
   the current blockage layer is provided in a region which contains the p-side current injection portion in plan view; and
   when a straight line passing through an arbitrary position in the p-side current injection portion and extending to the n-side current injection portion such that the distance between that position and the n-side current injection portion becomes shortest is defined as a straight line L, the center of the width of the p-side current injection portion in the direction of the straight line L is defined as a center O, and the center of the width of the current blockage layer in the direction of the straight line L is defined as a center O', the center O and the center O' do not overlap in the direction of the straight line L.

2. A light-emitting device according to claim 1, wherein the center O' of the width of the current blockage layer in the direction of the straight line L is located more remote from the n-side current injection portion in the direction of the straight line than is the center O of the width of the p-side current injection portion in the direction of the straight line L.

3. A light-emitting device according to claim 1, wherein the center O' of the width of the current blockage layer in the direction of the straight line L is located closer to the n-side current injection portion in the direction of the straight line than is the center O of the width of the p-side current injection portion in the direction of the straight line L.

4. A light-emitting device according to claim 1, which mixedly includes a layout in which the center O' of the width of the current blockage layer in the direction of the straight line L is located more remote from the n-side current injection portion in the direction of the straight line than is the center O of the width of the p-side current injection portion in the direction of the straight line L, and a layout in which the center O' of the width of the current blockage layer in the direction of the straight line L is located closer to the n-side current injection portion in the direction of the straight line than is the center O of the width of the p-side current injection portion in the direction of the straight line L.

5. A light-emitting device according to claim 4, wherein
when the distance between each p-side current injection portion and the n-side current injection portion closest to that p-side current injection portion assumes one of a plurality of values between a maximum distance and a minimum distance and one half of the sum of the maximum distance and the minimum distance is defined as an average distance,
for a p-side current injection portion whose distance to the closest n-side current injection portion is between the maximum distance and the average distance, there is used the layout in which the center O' of the width of the current blockage layer in the direction of the straight line L is located more remote from the n-side current injection portion in the direction of the straight line than is the center O of the width of the p-side current injection portion in the direction of the straight line L.

6. A light-emitting device according to claim 4, wherein
when the distance between each p-side current injection portion and the n-side current injection portion closest to that p-side current injection portion assumes one of a plurality of values between a maximum distance and a minimum distance and one half of the sum of the maximum distance and the minimum distance is defined as an average distance,
for a p-side current injection portion whose distance to the closest n-side current injection portion is between the minimum distance and the average distance, there is used the layout in which the center O' of the width of the current blockage layer in the direction of the straight line L is located closer to the n-side current injection portion in the direction of the straight line than is the center O of the width of the p-side current injection portion in the direction of the straight line L.

7. A light-emitting device according to claim 5, wherein
when the distance between each p-side current injection portion and the n-side current injection portion closest to that p-side current injection portion assumes one of a plurality of values between a maximum distance and a minimum distance and one half of the sum of the maximum distance and the minimum distance is defined as an average distance,
for a p-side current injection portion whose distance to the closest n-side current injection portion is between the minimum distance and the average distance, there is used the layout in which the center O' of the width of the current blockage layer in the direction of the straight line L is located closer to the n-side current injection portion in the direction of the straight line than is the center O of the width of the p-side current injection portion in the direction of the straight line L.

8. A light-emitting device according to claim 1, wherein, for each p-side current injection portion, a positional deviation of the center O' of the current blockage layer from the center O of the p-side current injection portion and the direction of the positional deviation are determined in order to obtain a planar light emission distribution which is more uniform than a planar light emission distribution obtained when the center O of the A-side current injection portion and the center O' of the current blockage layer are rendered coincident with each other.

9. A light-emitting device according to claim 1, wherein the entirety or a portion of a blockage layer outline of a planar pattern of the current blockage layer which contains the p-side current injection portion is an outline obtained through similarity enlargement of an injection portion outline of a planar pattern of the p-side current injection portion.

10. A light-emitting device according to claim 9, wherein the blockage layer outline has a shape obtained by partially cutting away a shape obtained through similarity enlargement of the injection portion outline with the centroid of the injection portion outline used as the center of the enlargement.

11. A light-emitting device according to claim 1, wherein the sheet resistance of the transparent electrode in a region above the current blockage layer is higher the sheet resistance of the transparent electrode in a region above the p-layer.

12. A light-emitting device according to claim 1, wherein the transparent electrode is made of an indium-oxide-base material.

13. A light-emitting device according to claim 12, wherein the transparent electrode is made of IZO.

14. A light-emitting device according to claim 1, wherein the current blockage layer is made of a transparent insulator which contains oxygen as a constituent element.

15. A light-emitting device according to claim 1, wherein the current blockage layer is made of a silicon compound.

16. A light-emitting device according to claim 15, wherein the current blockage layer is made of $SiO_2$.

17. A light-emitting device according to claim 1, further comprising:
an insulation film located on the transparent electrode and having a hole for injecting current to the transparent electrode; and
a p-electrode located on the insulation film,
wherein the p-electrode is in contact with the transparent electrode through the hole, and
a portion of the p-electrode which is located within the hole and is in contact with the transparent electrode serves as the p-side current injection portion.

18. A light-emitting device according to claim 1, further comprising:
an intermediate electrode which is located on the transparent electrode and is in contact with the transparent electrode;
an insulation film located on the transparent electrode and the intermediate electrode and having a hole for injecting current to the intermediate electrode; and
a p-electrode located on the insulation film,
wherein the p-electrode is in contact with the intermediate electrode, and the intermediate electrode serves as the p-side current injection portion.

19. A light-emitting device according to claim 1, further comprising:

a p-electrode which is located on the transparent electrode and is in contact with the transparent electrode, wherein the p-electrode has a connection portion which is electrically connected to an external circuit, and a wiring-like portion extending from the connection portion as wiring, and the p-electrode serves as the p-side current injection portion.

20. A light-emitting device according to of claim 1, wherein the minimum positional deviation between the center O' of the current blockage layer and the center O of the p-side current injection portion is 2 μm.

* * * * *